United States Patent
Makiyama

(10) Patent No.: US 9,324,821 B2
(45) Date of Patent: Apr. 26, 2016

(54) COMPOUND SEMICONDUCTOR DEVICE AND MANUFACTURING METHOD OF THE SAME

(71) Applicant: FUJITSU LIMITED, Kawasaki-shi, Kanagawa (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/664,745

(22) Filed: Oct. 31, 2012

(65) Prior Publication Data

US 2013/0146889 A1    Jun. 13, 2013

(30) Foreign Application Priority Data

Dec. 7, 2011    (JP) .................................. 2011-268237

(51) Int. Cl.
| | | |
|---|---|---|
| *H01L 29/423* | (2006.01) | |
| *H01L 29/66* | (2006.01) | |
| *H01L 29/778* | (2006.01) | |
| *H01L 29/06* | (2006.01) | |
| *H01L 29/08* | (2006.01) | |
| *H01L 29/20* | (2006.01) | |

(52) U.S. Cl.
CPC ...... *H01L 29/42316* (2013.01); *H01L 29/0661* (2013.01); *H01L 29/0843* (2013.01); *H01L 29/2003* (2013.01); *H01L 29/66462* (2013.01); *H01L 29/7787* (2013.01)

(58) Field of Classification Search
None
See application file for complete search history.

(56) References Cited

U.S. PATENT DOCUMENTS

| | | | |
|---|---|---|---|
| 6,507,051 B1 | 1/2003 | Hara | |
| 8,044,433 B2 | 10/2011 | Kawasaki et al. | |
| 2006/0220065 A1 | 10/2006 | Kawasaki et al. | |
| 2008/0204140 A1* | 8/2008 | Kikkawa | H03F 1/0288 330/277 |
| 2009/0242938 A1* | 10/2009 | Niiyama | H01L 29/0843 257/194 |
| 2010/0155741 A1* | 6/2010 | Ohki | H01L 29/2003 257/76 |
| 2010/0327322 A1* | 12/2010 | Kub | H01L 29/0847 257/194 |
| 2011/0127540 A1 | 6/2011 | Yamada et al. | |
| 2011/0169014 A1 | 7/2011 | Yamaki et al. | |

FOREIGN PATENT DOCUMENTS

| | | |
|---|---|---|
| JP | 2001-60684 A1 | 3/2001 |
| JP | 2005-159117 A | 6/2005 |
| JP | 2005-203544 A | 7/2005 |
| JP | 2006-286740 | 10/2006 |

(Continued)

OTHER PUBLICATIONS

Notice of Preliminary Rejection mailed Sep. 5, 2013 from the Korean Intellectual Property Office in counterpart application No. 10-2012-129914 with English translation.

(Continued)

*Primary Examiner* — Steven Loke
*Assistant Examiner* — Juanita Rhodes
(74) *Attorney, Agent, or Firm* — Kratz, Quintos & Hanson, LLP

(57) ABSTRACT

An embodiment of a compound semiconductor device includes: a substrate; a nitride compound semiconductor stacked structure formed on or above the substrate; and a gate electrode, a source electrode and a drain electrode formed on or above the compound semiconductor stacked structure. A recess positioning between the gate electrode and the drain electrode in a plan view is formed at a surface of the compound semiconductor stacked structure.

3 Claims, 23 Drawing Sheets

(56) References Cited

FOREIGN PATENT DOCUMENTS

| | | |
|---|---|---|
| JP | 2011-003808 | 1/2011 |
| JP | 2011-103377 A | 5/2011 |
| JP | 2011-114269 A | 6/2011 |
| JP | 2011-171595 | 9/2011 |
| KR | 2011-0105032 | 9/2011 |

OTHER PUBLICATIONS

Chinese Office Action for the Corresponding CN Application No. 201210458928.5, mailed on Mar. 9, 2015, with full translation.

Office Action of Japanese Patent Application 2011-268237 dated Apr. 21, 2015. Translation of the relevant part, pp. 1, line 20 to p. 5 line 2, of the office action.

Taiwanese Office Action of Taiwanese Patent Application 101139283 dated Sep. 16, 2014, partial translation.

Office Action of Taiwanese Patent Application 101139283 dated Nov. 10, 2015, with translation of the relevant part, summary of the Office Action.

\* cited by examiner

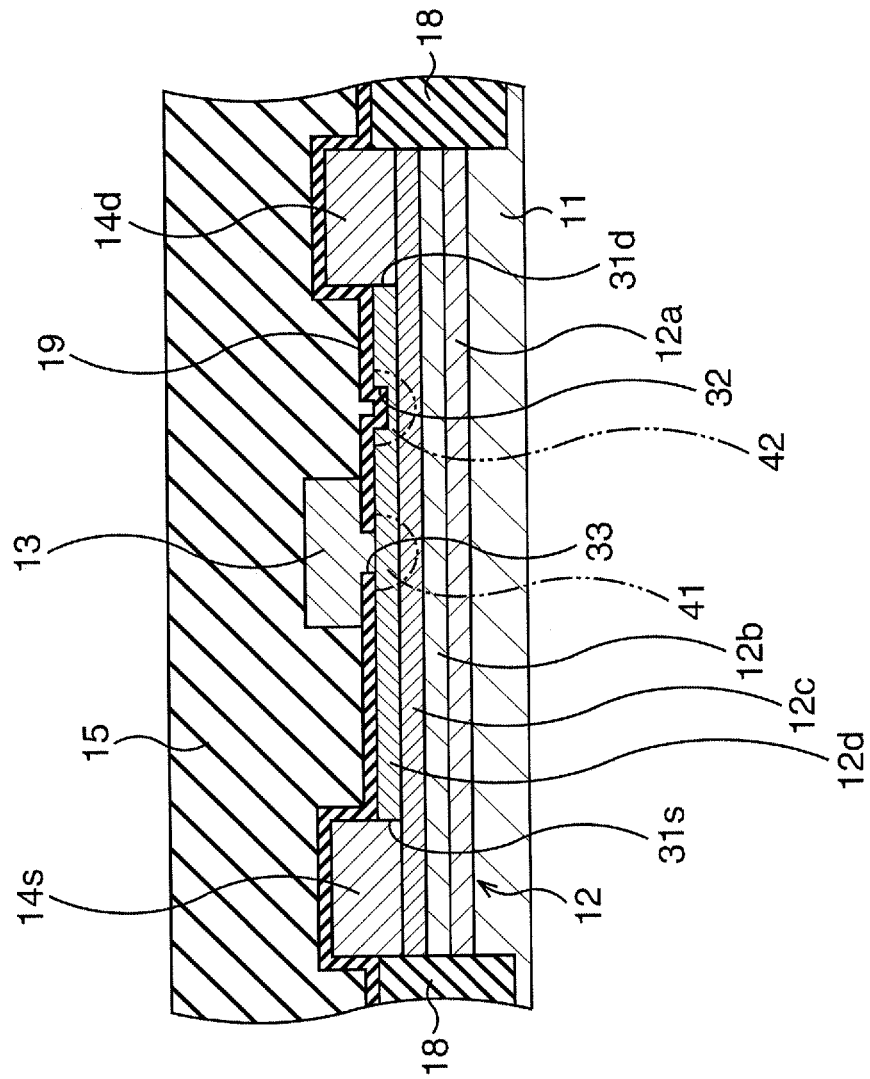

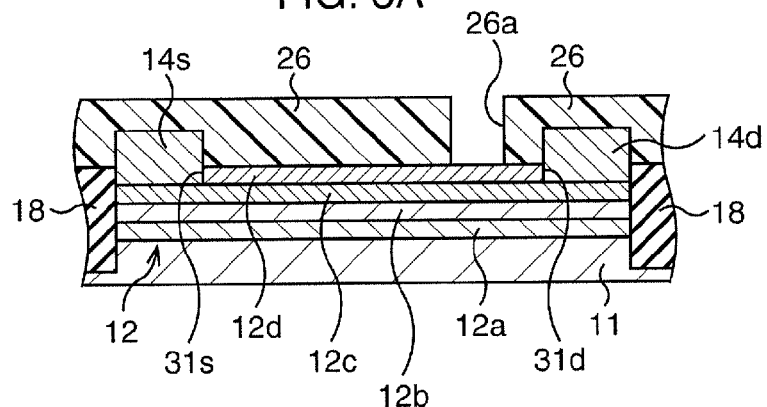
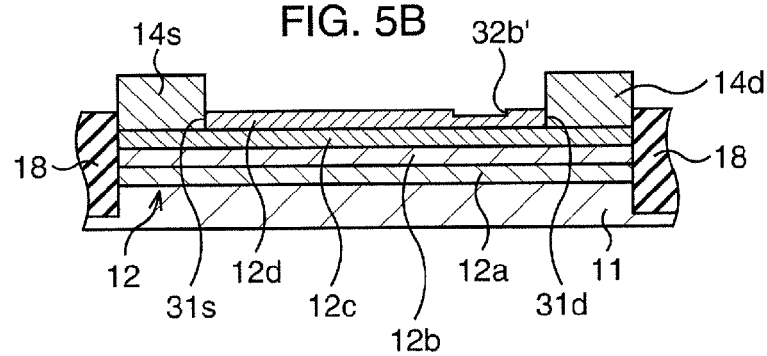
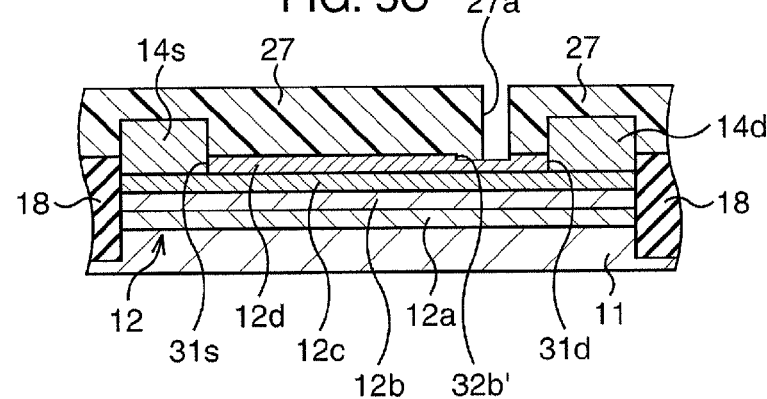
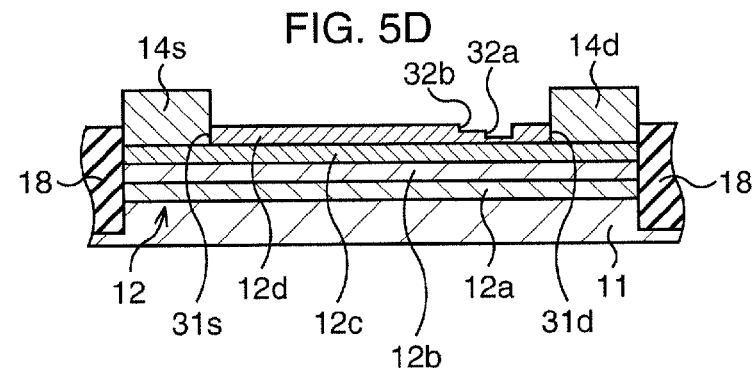

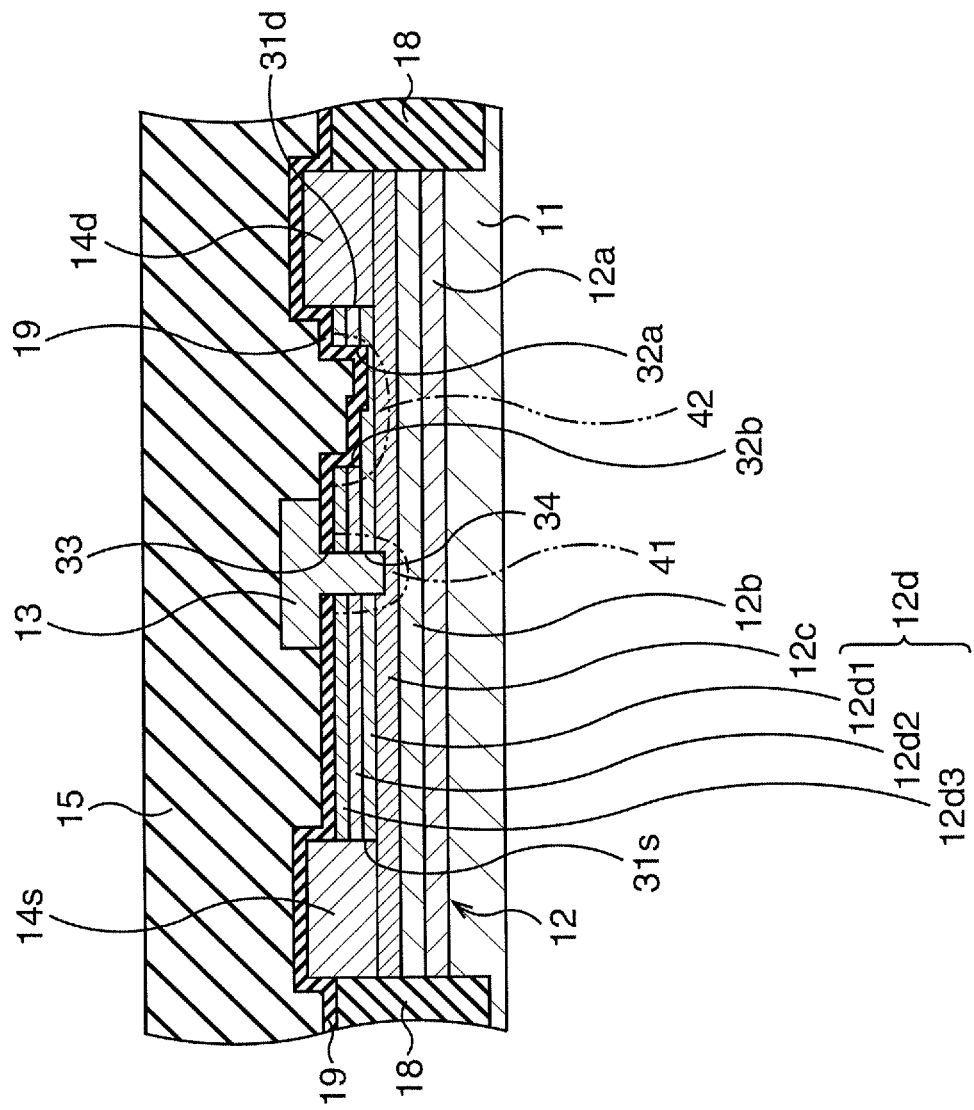

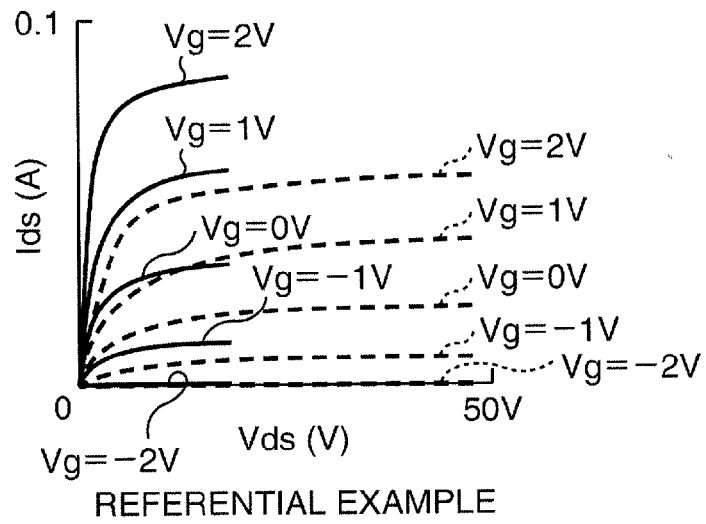
FIG. 17A  REFERENTIAL EXAMPLE
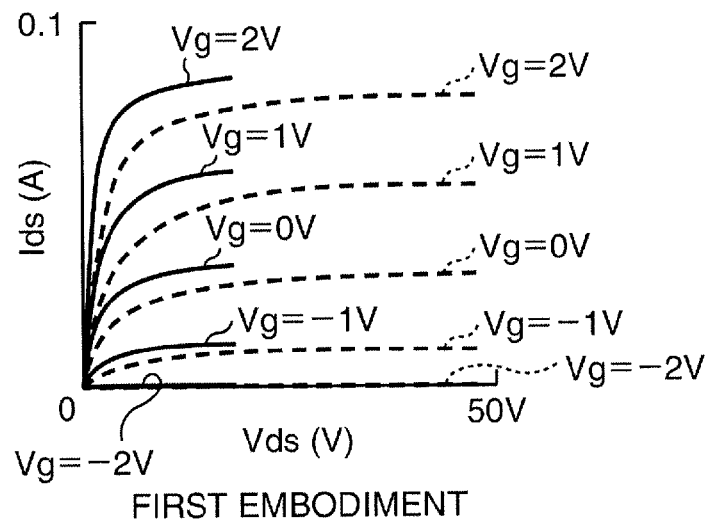
FIG. 17B  FIRST EMBODIMENT
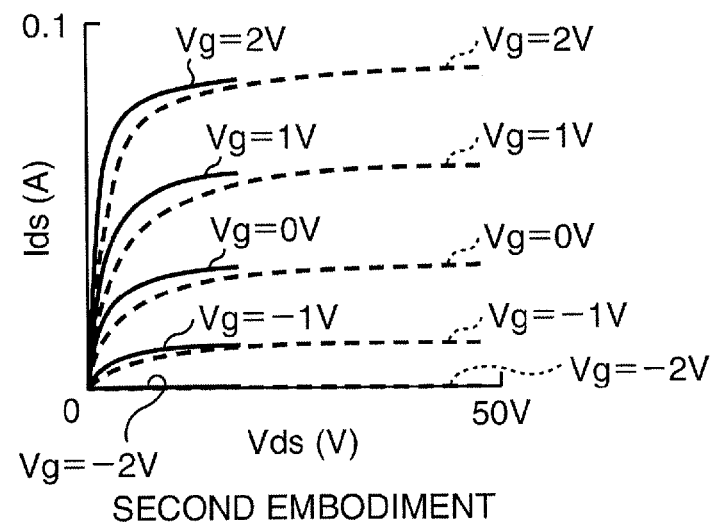
FIG. 17C  SECOND EMBODIMENT

COMPOUND SEMICONDUCTOR DEVICE AND MANUFACTURING METHOD OF THE SAME

CROSS-REFERENCE TO RELATED APPLICATION

This application is based upon and claims the benefit of priority of the prior Japanese Patent Application No. 2011-268237, filed on Dec. 7, 2011, the entire contents of which are incorporated herein by reference.

FIELD

The embodiments discussed herein are directed to a compound semiconductor device, a manufacturing method thereof and so on.

BACKGROUND

In a high power and high frequency device using a compound semiconductor device, in particular, a high electron mobility transistor (HEMT) containing nitride such as GaN, an increase of on-resistance caused by a current collapse is acknowledged as a problem. The current collapse occurs caused by an electric field concentration in a vicinity of a drain side edge of a gate electrode and so on.

Accordingly, a structure in which a conductive film called as a field plate is connected to a source electrode has been studied to reduce the increase of the on-resistance caused by the current collapse and further, to reduce a lowering of an output current. The field plate is sometimes called as a source wall. In this structure, the field plate passes at upward of the gate electrode from the source electrode, and extents to an upward of an arbitrary position between the gate electrode and the drain electrode, and a ground potential is applied to the source electrode and the field plate. According to the structure, the electric field concentration between the gate electrode and the drain electrode is controlled, and the electric field intensity at the drain side edge of the gate electrode is lowered. The current collapse is thereby suppressed. In particular, it is effective for a high frequency and high power device used for a communication and so on.

However, the current collapse is reduced but on the other hand, a gain is also lowered in a conventional HEMT using a field plate.

[Patent Literature 1] Japanese Laid-open Patent Publication No. 2001-60684

SUMMARY

According to an aspect of the embodiments, a compound semiconductor device includes: a substrate; a nitride compound semiconductor stacked structure formed on or above the substrate; and a gate electrode, a source electrode and a drain electrode formed on or above the compound semiconductor stacked structure. A recess positioning between the gate electrode and the drain electrode in a plan view is formed at a surface of the compound semiconductor stacked structure.

According to another aspect of the embodiments, a method of manufacturing a compound semiconductor device includes: forming a nitride compound semiconductor stacked structure on or above a substrate; forming a gate electrode, a source electrode and a drain electrode on or above the compound semiconductor stacked structure; and forming a recess positioning between the gate electrode and the drain electrode in a plan view at a surface of the compound semiconductor stacked structure.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 2A is a sectional view illustrating a structure of a compound semiconductor device according to a first embodiment;

FIG. 5A to FIG. 5D are sectional views illustrating a method of manufacturing the compound semiconductor device according to the second embodiment in process sequence;

FIG. 9 is a sectional view illustrating a structure of a compound semiconductor device according to a fifth embodiment;

FIG. 17A to FIG. 17C are views illustrating results of a first experiment; and

DESCRIPTION OF EMBODIMENTS

Figure 1:
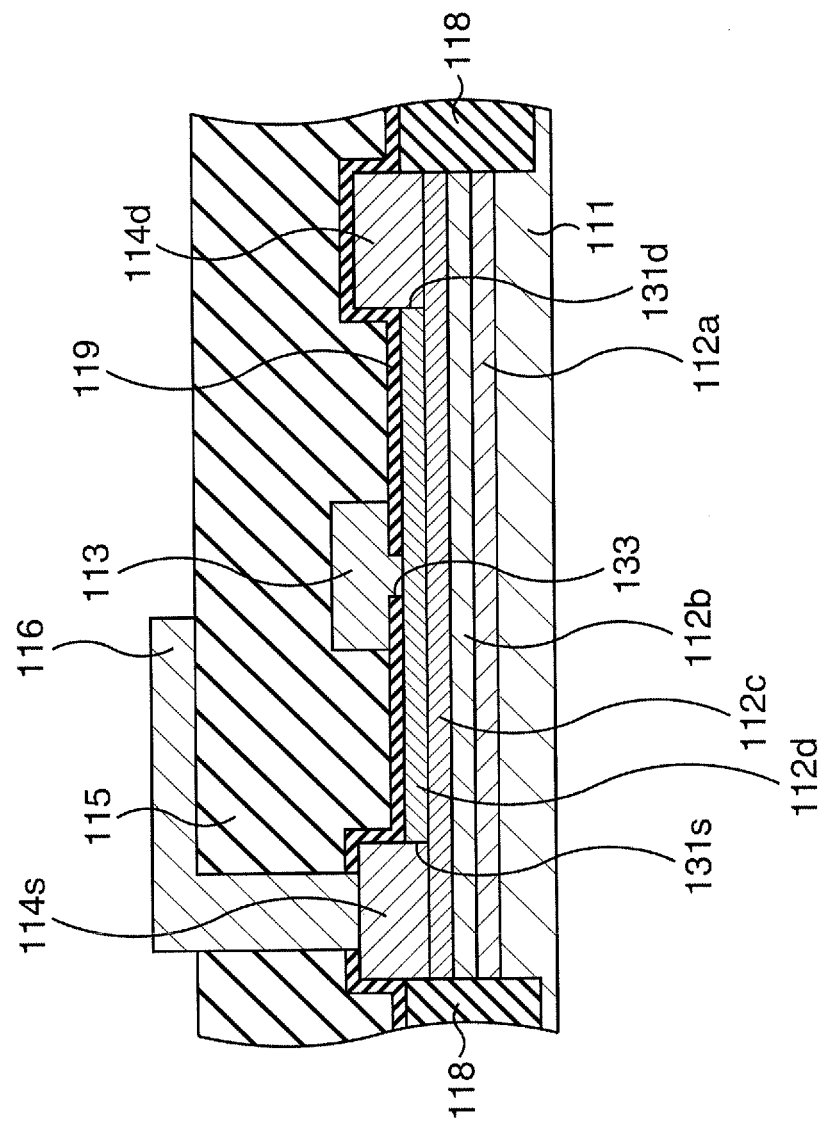
FIG. 1 is a sectional view illustrating a structure of a referential example.

The present inventor studied as for causes in which a gain is lowered in a conventional HEMT. As a result, the inventor found that a parasitic capacitance $C_{gs}$ between a field plate 116 and a gate electrode 113 and a parasitic capacitance $C_{ds}$ between the field plate 116 and a drain electrode 114d increase according to an existence of the field plate 116 connected to a source electrode 114s as a referential example illustrated in FIG. 1, and this incurs the lowering of the gain.

Note that in the referential example, a buffer layer 112a, an electron transit layer 112b, an electron supply layer 112c and a surface layer 112d are formed on a substrate 111. Two-dimensional electron gas (2DEG) exists in the vicinity of the boundary with the electron supply layer 112c in the electron transit layer 112b. An element isolation region 118 defining an active region is formed in the buffer layer 112a, the electron transit layer 112b, the electron supply layer 112c and the surface layer 112d. Recesses 131s and 131d exposing the electron supply layer 112c are formed in the surface layer 112d, the source electrode 114s is formed in the recess 131s, and the drain electrode 114d is formed in the recess 131d. Further, an insulating film 119 covering the surface layer 112d, the source electrode 114s and the drain electrode 114d is formed. An opening 133 is formed at an approximately intermediate position between the source electrode 114s and the drain electrode 114d in the insulating film 119. The gate electrode 113 which is in contact with the surface layer 112d via the opening 133 is formed on the insulating film 119. Besides, an insulating film 115 covering the gate electrode 113 is formed on the insulating film 119. The field plate 116 is connected to the source electrode 114s, and formed on the insulating film 115.

The present inventor studied hard based on the above-stated knowledge, and came to constitutions of embodiments described below.

First Embodiment

First, a first embodiment is described. FIG. 2A is a sectional view illustrating a structure of a GaN-based HEMT (compound semiconductor device) according to the first embodiment.

In the first embodiment, for example, a buffer layer 12a, an electron transit layer 12b, an electron supply layer 12c and a surface layer 12d are formed on or above a substrate 11 of a semi-insulating SiC substrate and so on, as illustrated in FIG. 2A. The buffer layer 12a, the electron transit layer 12b, the electron supply layer 12c and the surface layer 12d are included in a nitride compound semiconductor stacked structure 12. The buffer layer 12a and the electron transit layer 12b are GaN layers (i-GaN layers) in which, for example, impurities are not doped, and a total thickness thereof is approximately 3 μm. The buffer layer 12a prevents propagation of a lattice defect existing at a surface of the substrate 11 to the electron transit layer 12b. The electron supply layer 12c is, for example, an n-type AlGaN layer (n-AlGaN layer), and a thickness thereof is approximately 10 nm. The surface layer 12d is, for example, an n-type GaN layer (n-GaN layer), and a thickness thereof is 10 nm or less. Two-dimensional electron gas (2DEG) exists in the vicinity of the boundary with the electron supply layer 12c in the electron transit layer 12b.

Besides, an element isolation region 18 defining an active region is formed in the buffer layer 12a, the electron transit layer 12b, the electron supply layer 12c and the surface layer 12d. Recesses 31s and 31d exposing the electron supply layer 12c are formed in the surface layer 12d, a source electrode 14s is formed in the recess 31s, and a drain electrode 14d is formed in the recess 31d. Further, an insulating film 19 covering the surface layer 12d, the source electrode 14s and the drain electrode 14d is formed. A silicon nitride film is formed as the insulating film 19, for example, and a thickness thereof is approximately 50 nm, for example. An opening 33 is formed at an approximately intermediate position between the source electrode 14s and the drain electrode 14d in the insulating film 19. A gate electrode 13 which is in contact with the surface layer 12d via the opening 33 is formed on the insulating film 19. Besides, an insulating film 15 covering the gate electrode 13 is formed on the insulating film 19. Note that the gate electrode 13 does not necessarily position at a center between the source electrode 14s and the drain electrode 14d.

In the present embodiment, a recess 32 getting across between the drain electrode 14d and the gate electrode 13 in a plan view is formed at a surface of the surface layer 12d. The insulating film 19 is formed to get into the recess 32.

In the GaN-based HEMT constituted as stated above, the recess 32 is formed at the surface of the surface layer 12d, and therefore, not only a depletion layer 41 spreads in a vicinity of the gate electrode 13 but also a depletion layer 42 spreads in a vicinity of the recess 32, as illustrated in FIG. 2A. Accordingly, an electric field concentration region is formed between the gate electrode 13 and the drain electrode 14d in a plan view. As a result, potential drops occur not only in the vicinity of the gate electrode 13 but also in the vicinity of the recess 32, and an electric field intensity in the vicinity of the gate electrode 13 is lowered. Accordingly, expansion of the depletion layer 41 resulting from electron capture in the vicinity of the gate electrode 13 is reduced, and the current collapse is suppressed. As stated above, according to the present embodiment, it is possible to suppress the current collapse, even though a field plate is not provided. The field plate does not exist, and therefore, increases of the parasitic capacitance $C_{gs}$ and the parasitic capacitance $C_{ds}$ are avoided, and high gain can be obtained.

Figure 2B:
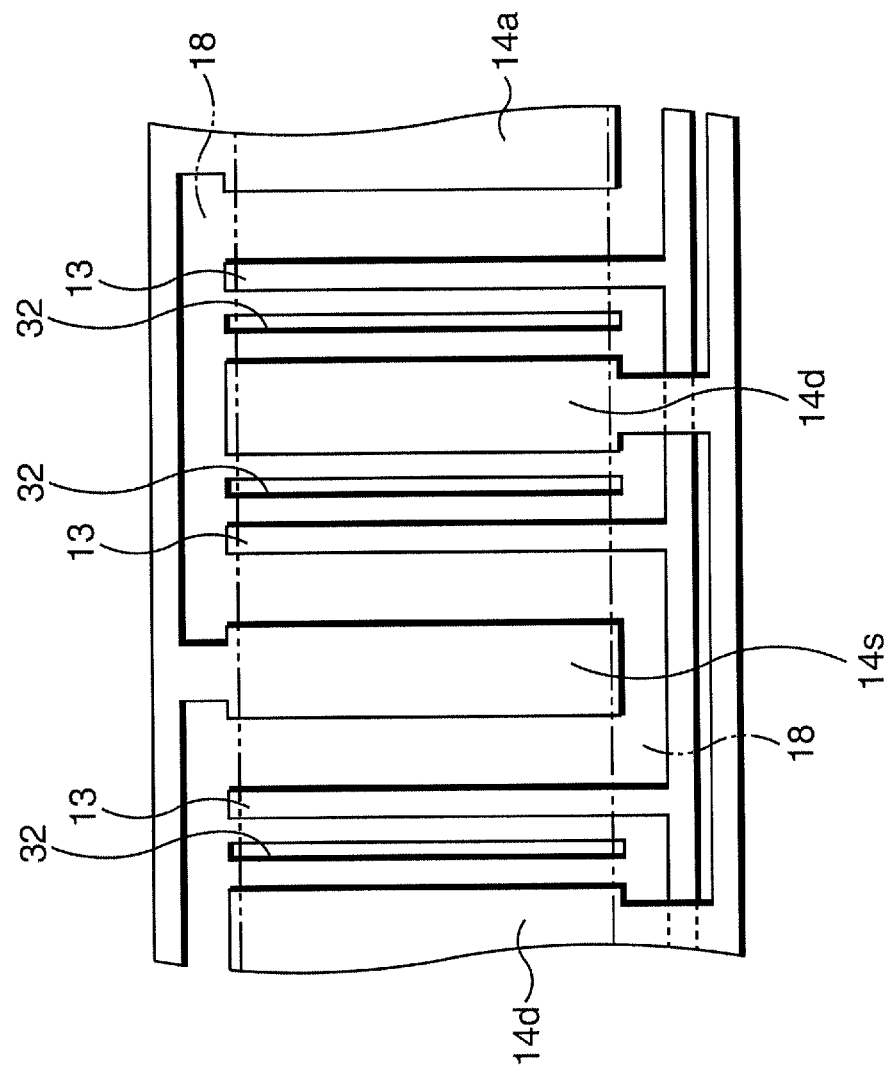
FIG. 2B is a view illustrating a layout of the compound semiconductor device according to the first embodiment.

A layout when it is seen from a surface side of the substrate 11 is, for example, as illustrated in FIG. 2B. Namely, planer shapes of the gate electrode 13, the source electrode 14s and the drain electrode 14d are comb-teeth shapes, and the source electrodes 14s and the drain electrodes 14d are alternately disposed. Besides, the recess 32 is formed to extend in a direction parallel to the gate electrode 13 and the drain electrode 14d between the gate electrode 13 and the drain electrode 14d in a plan view, and a region between the gate electrode 13 and the drain electrode 14d is divided into two by the recess 32 in the element region defined by the element isolation region 18. Plural gate electrodes 13 are commonly connected with each other, plural source electrodes 14s are commonly connected with each other, and plural drain electrodes 14d are commonly connected with each other. It is possible to improve an output by applying a multi-finger gate structure as stated above.

Next, a method of manufacturing the GaN-based HEMT according to the first embodiment is described. FIG. 3A to FIG. 3M are sectional views illustrating the method of manufacturing the GaN-based HEMT according to the first embodiment in process sequence.

Figure 3A:
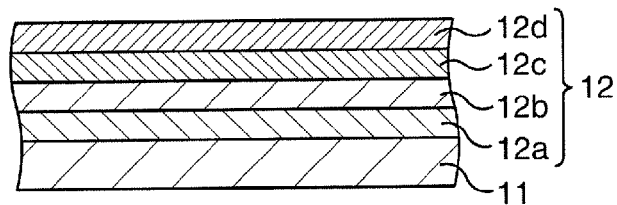
FIG. 3A to FIG. 3M are sectional views illustrating a method of manufacturing the compound semiconductor device according to the first embodiment in process sequence.

First, the buffer layer 12a, the electron transit layer 12b, the electron supply layer 12c and the surface layer 12d are epitaxially grown on or above the substrate 11 such as, for example, a semi-insulating SiC substrate by a metal organic chemical vapor deposition (MOCVD) method, for example, as illustrated in FIG. 3A. The buffer layer 12a, the electron transit layer 12b, the electron supply layer 12c and the surface layer 12d are included in the compound semiconductor stacked structure 12.

Figure 3B:
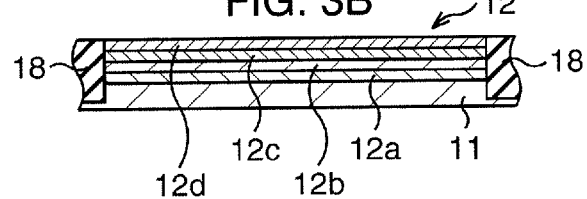

Next, Ar is selectively injected to the compound semiconductor stacked structure 12, and thereby, the element isolation region 18 defining the active region is formed in the compound semiconductor stacked structure 12 and in a surface layer part of the substrate 11, as illustrated in FIG. 3B.

Figure 3C:
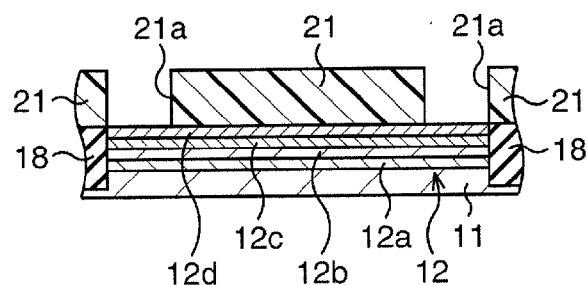

Then, a resist pattern 21 having openings 21a at a region where the source electrode is to be formed and at a region where the drain electrode is to be formed is formed on the compound semiconductor stacked structure 12, as illustrated in FIG. 3C.

Figure 3D:
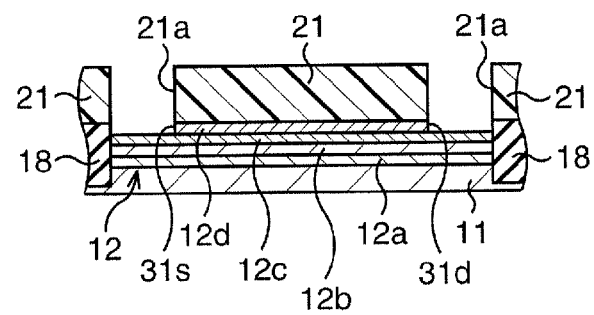

Subsequently, a dry etching of the surface layer 12d is performed using inert gas and chlorine gas such as $Cl_2$ gas with the resist pattern 21 as a mask to thereby form the recesses 31s and 31d in the surface layer 12d, as illustrated in FIG. 3D. Note that a part of the surface layer 12d may be remained or a part of the electron supply layer 12c may be removed as for depths of the recesses 31s and 31d. Namely, the depths of the recesses 31s and 31d do not necessary match with a thickness of the surface layer 12d.

Figure 3E:
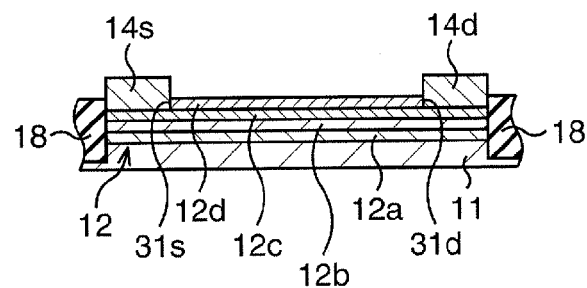

Next, the source electrode 14s is formed in the recess 31s, and the drain electrode 14d is formed in the recess 31d, as illustrated in FIG. 3E. When the source electrode 14s and the drain electrode 14d are formed, for example, first, a Ti layer is formed by a vapor deposition method, and an Al layer is formed thereon by a vapor deposition method. A thickness of the Ti layer is approximately 20 nm, and a thickness of the Al layer is approximately 200 nm. The resist pattern 21 used for the formation of the recesses 31s and 31d is removed together with the Ti layer and the Al layer formed thereon. Namely, the vapor deposition and a lift-off technology are used for the formation of the source electrode 14s and the drain electrode 14d, for example. Then, a heat treatment at approximately 550° C. is performed, and thereby, the source electrode 14s and the drain electrode 14d come in ohmic contact with the surface of the compound semiconductor stacked structure 12 (a surface of the electron supply layer 12c). Note that a resist pattern used for the lift-off may be different from the resist pattern 21 used for the formation of the recesses 31s and 31d. For example, a resist with an eaves structure may be used.

Figure 3F:
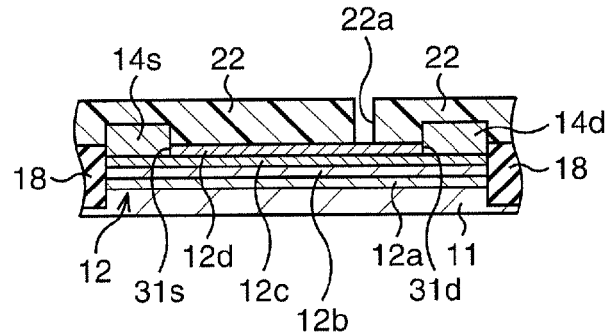

Subsequently, a resist pattern 22 having an opening 22a at a region where the recess 32 is to be formed is formed on the compound semiconductor stacked structure 12, the source electrode 14s and the drain electrode 14d, as illustrated in FIG. 3F. For example, PFI-32 manufactured by Sumitomo Chemical Co., Ltd. is used as a material of the resist pattern 22. Besides, an ultraviolet exposure is performed for the exposure when the opening 22a is formed, and for example, NMD-W manufactured by Tokyo Ohka Kogyo Co., Ltd. is used as a developing solution.

Figure 3G:
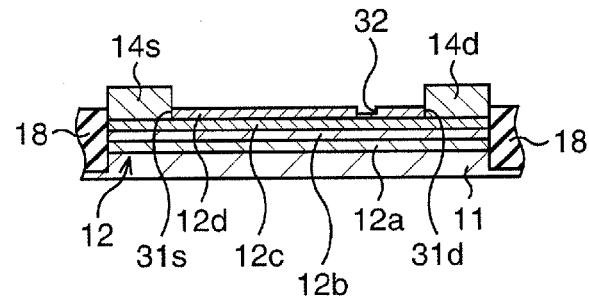

Next, a dry-etching is performed with the resist pattern 22 as a mask to thereby form the recess 32 at the surface of the surface layer 12d, as illustrated in FIG. 3G. For example, $Cl_2$ gas is used in this dry-etching. A width of the recess 32 is, for example, approximately 500 nm. The resist pattern 22 is removed after the formation of the recess 32.

Figure 3H:
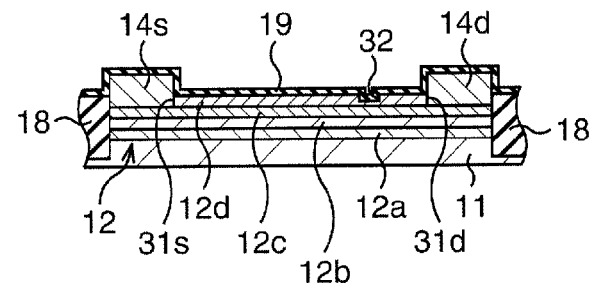

Then, the insulating film 19 covering the source electrode 14s and the drain electrode 14d is formed at a whole surface of the compound semiconductor stacked structure 12, as illustrated in FIG. 3H. A silicon nitride (SiN) film is formed by a plasma CVD method as the insulating film. 19, for example.

Figure 3I:
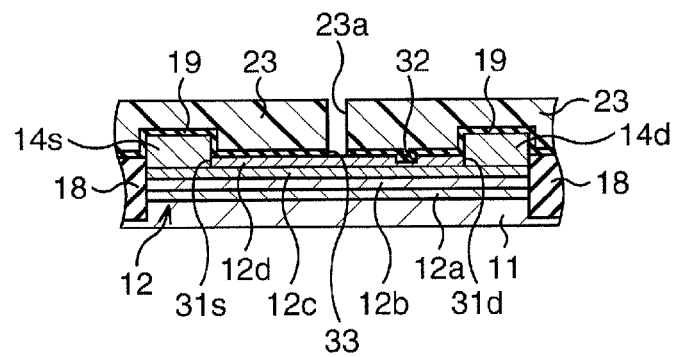

Next, a resist pattern 23 having an opening 23a at a region where an opening for the gate electrode is to be formed is formed on the insulating film 19, as illustrated in FIG. 3I. For example, PFI-32 manufactured by Sumitomo Chemical Co., Ltd. is used as a material of the resist pattern 23. Besides, an ultraviolet exposure is performed for the exposure when the opening 23a is formed, and for example, NMD-W manufactured by Tokyo Ohka Kogyo Co., Ltd. is used as a developing solution. A dry-etching is performed with the resist pattern 23 as a mask to thereby form the opening 33 in the insulating film 19. For example, $SF_6$ gas is used in this dry-etching. A width of the opening 33 is, for example, approximately 600 nm. The resist pattern 23 is removed after the formation of the opening 33.

Figure 3J:
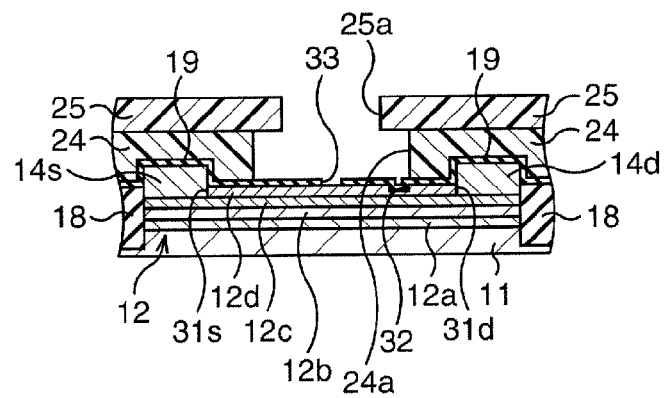

Subsequently, a resist pattern 24 having an opening 24a for the gate electrode and a resist pattern 25 having an opening 25a which is narrower than the opening 24a are formed on the insulating film 19, as illustrated in FIG. 3J. For example, polymethylglutarimide (PMCI) (for example, manufactured by Micro-Chem Inc. in the United States) is used as a material of the resist pattern 24, and for example, PFI-32 manufactured by Sumitomo Chemical Co., Ltd. is used as a material of the resist pattern 25. Besides, an ultraviolet exposure is performed for the exposure when the openings 24a and 25a are formed, and for example, NMD-W manufactured by Tokyo Ohka Kogyo Co., Ltd. is used as a developing solution. A width of the opening 25a is, for example, approximately 1.5 μm. A multilayer resist in an eaves structure is obtained by the processes as stated above.

Figure 3K:
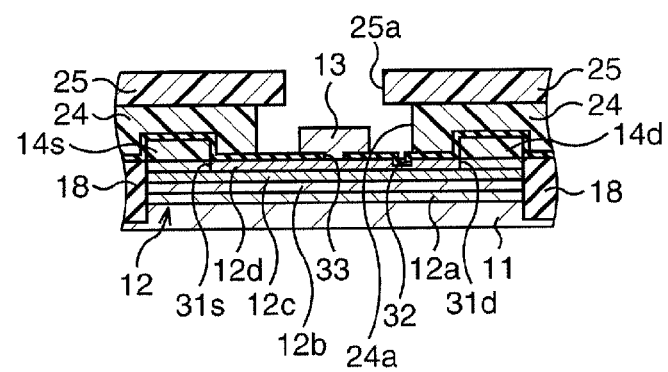

Next, the gate electrode 13 which is in contact with the surface layer 12d via the opening 33 is formed on the insulating film 19, as illustrated in FIG. 3K. For example, a Ni layer is formed by a vapor deposition method, and an Au layer is formed thereon by a vapor deposition method when the gate electrode 13 is formed. A thickness of the Ni layer is approximately 10 nm, and a thickness of the Au layer is approximately 300 nm.

Figure 3L:
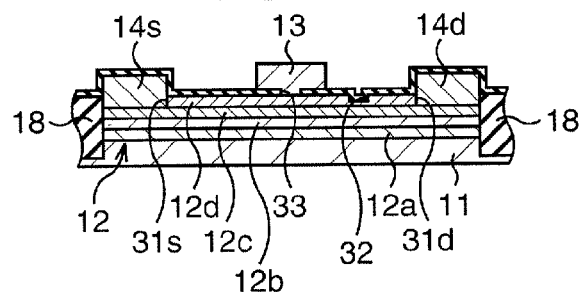

Then, the resist patterns 24 and 25 are removed together with the Ni layer and the Au layer formed thereon with a heated organic solvent, as illustrated in FIG. 3L. Namely, for example, the vapor deposition and lift-off technologies are used also for the formation of the gate electrode 13.

Figure 3M:
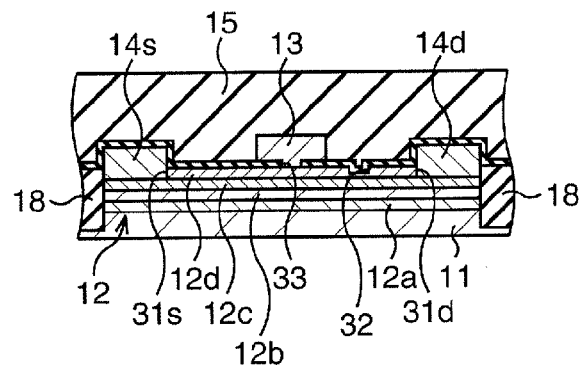

Subsequently, the insulating film 15 covering the gate electrode 13 is formed on the insulating film 19, as illustrated in FIG. 3M. A silicon nitride (SiN) film is formed by a plasma CVD method, for example, as the insulating film 15.

A protective film, wirings, and so on are formed according to need, to thereby complete the GaN-based HEMT (semiconductor device).

Note that a depth of the recess 32 is not particularly limited, but it is preferable that the surface layer 12d remains at a bottom of the recess 32. When the surface layer 12d does not remain at the bottom of the recess 32, namely, when the recess 32 reaches up to the electron supply layer 12c, there is a possibility in which alteration and so on of the surface of the electron supply layer 12c occurs, and there is a case when a trap level of an electric charge occurs if the alteration occurs. It is possible to suppress the occurrence of the trap level and to further improve the current collapse when the surface layer 12d remains at the bottom of the recess 32.

Second Embodiment

Figure 4:
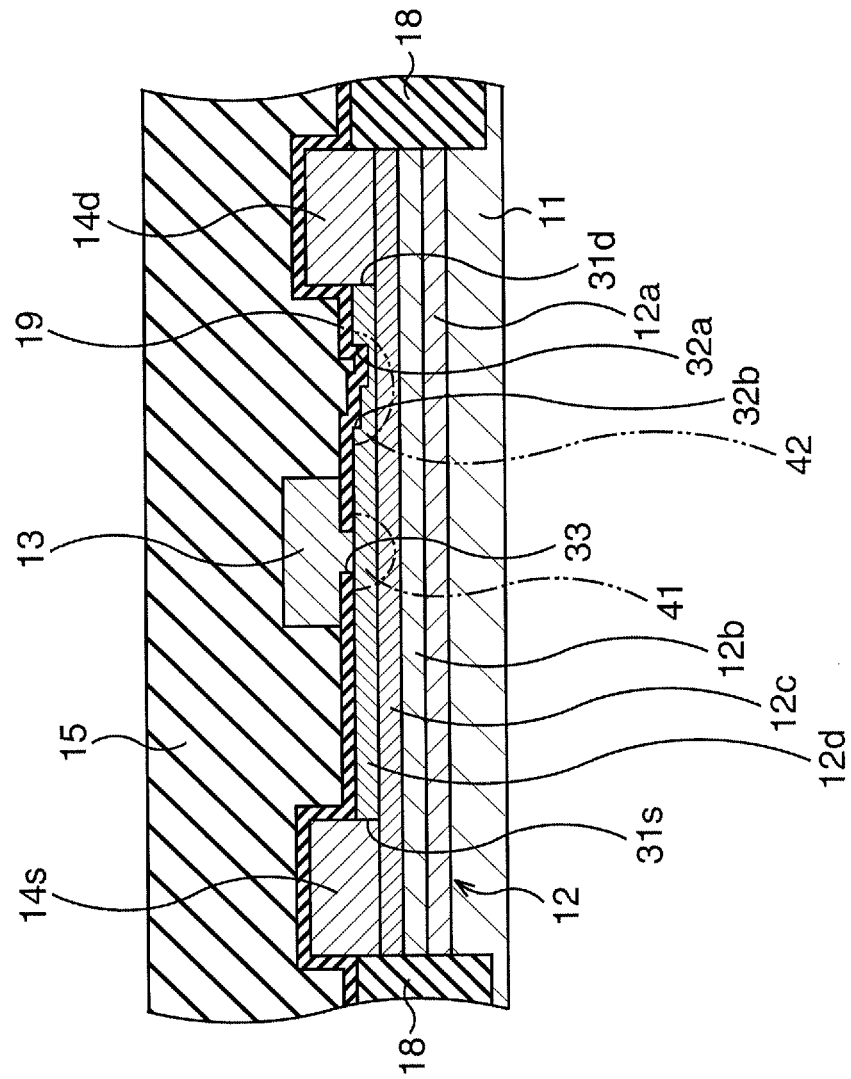
FIG. 4 is a sectional view illustrating a structure of a compound semiconductor device according to a second embodiment.

Next, a second embodiment is described. FIG. 4 is a sectional view illustrating a structure of a GaN-based HEMT (compound semiconductor device) according to the second embodiment.

In the second embodiment, two recesses 32a and 32b of which depths are different from one another are formed at the surface layer 12d, as illustrated in FIG. 4. Note that the recesses 32a and 32b are formed to extend in a direction parallel to the gate electrode 13 and the drain electrode 14d between the gate electrode 13 and the drain electrode 14d in a plan view as same as the recess 32. The recesses 32a and 32b continue with one another in a direction connecting the gate electrode 13 and the drain electrode 14d. The recess 32a positioning at the drain electrode 14d side is deeper than the recess 32b positioning at the gate electrode 13 side. A combination of the recesses 32a and 32b may be considered to be one recess having steps of which depths are different from one another in the direction connecting the gate electrode 13 and the drain electrode 14d. The other constitutions are the same as the first embodiment.

According to the second embodiment as stated above, a gradient of the depletion layer 42 is moderate compared to the first embodiment, as illustrated in FIG. 4. Accordingly, a gradient of the electric field moderately changes compared to the first embodiment. When the gradient of the electric field is relatively steep, there is a case when the electrons are captured by traps existing at the surface and so on of the compound semiconductor stacked structure 12 at a periphery thereof, and it causes an increase of the on-resistance. On the other hand, according to the second embodiment, it is possible to suppress the capture of the electrons as stated above and the increase of the on-resistance.

Next, a method of manufacturing the GaN-based HEMT according to the second embodiment is described. FIG. 5A to FIG. 5D are sectional views illustrating the method of manufacturing the GaN-based HEMT according to the second embodiment in process sequence.

First, the processes up to the formation of the source electrode 14s and the drain electrode 14d are performed as same as the first embodiment (FIG. 3E). Subsequently, a resist pattern 26 having an opening 26a at a region where the recesses 32a and 32b are to be formed is formed on the compound semiconductor stacked structure 12, the source electrode 14s and the drain electrode 14d, as illustrated in FIG. 5A. For example, PFI-32 manufactured by Sumitomo Chemical Co., Ltd. is used as a material of the resist pattern 26. Besides, an ultraviolet exposure is performed for the exposure when the opening 26a is formed, and, for example, NMD-W manufactured by Tokyo Ohka Kogyo Co., Ltd. is used as a developing solution.

Then, a dry-etching is performed with the resist pattern 26 as a mask to thereby form a recess 32b' at the surface of the surface layer 12d, as illustrated in FIG. 5B. For example, $Cl_2$ gas is used in this dry-etching. A width of the recess 32b' is, for example, approximately 1000 nm. The resist pattern 26 is removed after the recess 32b' is formed.

Subsequently, a resist pattern 27 having an opening 27a at a region where the recess 32a is to be formed is formed on the compound semiconductor stacked structure 12, the source electrode 14s and the drain electrode 14d, as illustrated in FIG. 5C. For example, PFI-32 manufactured by Sumitomo Chemical Co., Ltd. is used as a material of the resist pattern 27. Besides, an ultraviolet exposure is performed for the exposure when the opening 27a is formed, and for example, NMD-W manufactured by Tokyo Ohka Kogyo Co., Ltd. is used as a developing solution.

Next, a dry-etching is performed with the resist pattern 27 as a mask to thereby make the recess 32b' deeper and form the recess 32a, as illustrated in FIG. 5D. For example, $Cl_2$ gas is used in this dry-etching. A width of the recess 32a is, for example, approximately 500 nm. The resist pattern 27 is removed after the recess 32a is formed. A remainder of the recess 32b' is the recess 32b.

Then, the processes after the formation of the insulating film 19 are performed as same as the first embodiment. The GaN-based HEMT (semiconductor device) is thereby completed.

As stated above, the recesses 32a and 32b are formed by performing the formation of the resist mask and the dry-etching twice and so on, instead of the formation of the recess 32, for example, to manufacture the compound semiconductor device according to the second embodiment.

Note that depths of the recesses 32a and 32b are not particularly limited, but it is preferable that the surface layer 12d remains at a bottom of the recess 32a, which is deeper than the recess 32b. When the surface layer 12d does not remain at the bottom of the recess 32a, namely, when the recess 32a reaches up to the electron supply layer 12c, there is a possibility in which alteration and so on of the surface of the electron supply layer 12c occurs, and there is a case when a trap level of an electric charge occurs if the alteration occurs. It is possible to suppress the occurrence of the trap level and to further improve the current collapse when the surface layer 12d remains at the bottom of the recess 32a.

Third Embodiment

Figure 6:
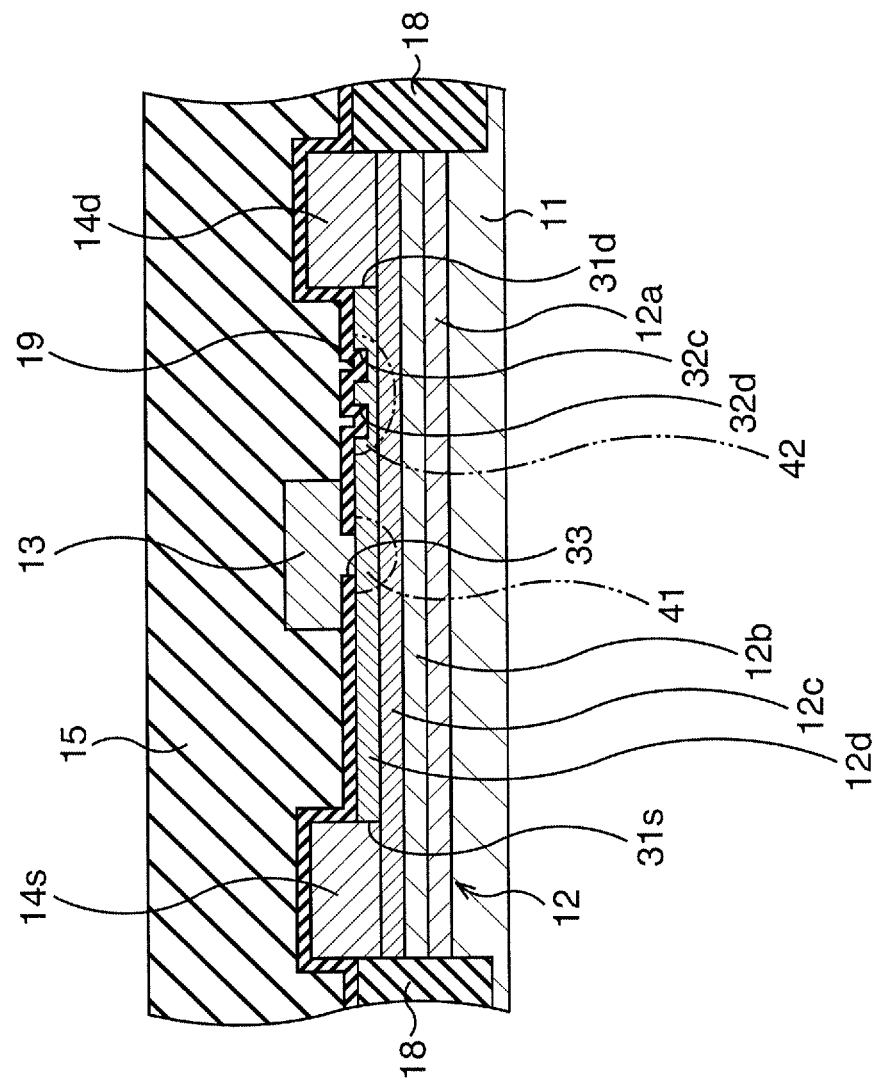
FIG. 6 is a sectional view illustrating a structure of a compound semiconductor device according to a third embodiment.

Next, a third embodiment is described. FIG. 6 is a sectional view illustrating a structure of a GaN-based HEMT (compound semiconductor device) according to the third embodiment.

In the third embodiment, two recesses 32c and 32d are formed at the surface layer 12d, as illustrated in FIG. 6. Note that the recesses 32c and 32d are formed to extend in a direction parallel to the gate electrode 13 and the drain electrode 14d between the gate electrode 13 and the drain electrode 14d in a plan view as same as the recess 32. The recesses 32c and 32d are apart from one another in a direction connecting the gate electrode 13 and the drain electrode 14d. A combination of the recesses 32c and 32d may be considered to be one recess including plural pieces separated into in the direction connecting the gate electrode 13 and the drain electrode 14d. The other constitutions are the same as the first embodiment.

According to the third embodiment as stated above, a gradient of the depletion layer 42 is moderate compared to the first embodiment, as illustrated in FIG. 6. Accordingly, it is possible to suppress the capture of the electrons and the increase of the on-resistance according thereto as same as the second embodiment.

Note that, for example, the recesses 32c and 32d may be formed instead of the recess 32 to manufacture the compound semiconductor device according to the third embodiment. Depths of the recesses 32c and 32d may be the same as one another or may be different from one another. When the depths of the recesses 32c and 32d are the same as one another, the number of times of the formation of the resist mask, the dry-etching, and so on may be once as same as the case when the recess 32 is formed.

Fourth Embodiment

Figure 7:
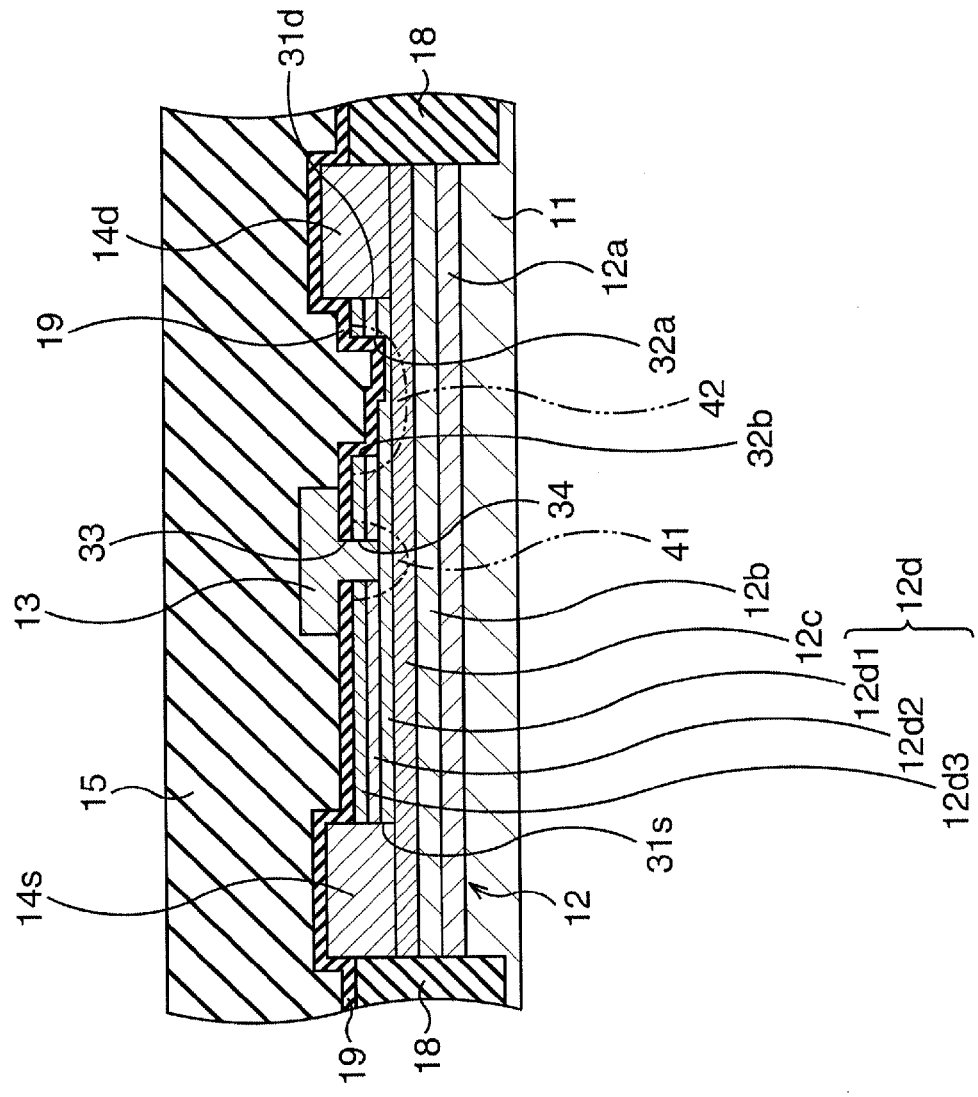
FIG. 7 is a sectional view illustrating a structure of a compound semiconductor device according to a fourth embodiment.

Next, a fourth embodiment is described. FIG. 7 is a sectional view illustrating a structure of a GaN-based HEMT (compound semiconductor device) according to the fourth embodiment.

In the fourth embodiment, a lower layer 12d1, an intermediate layer 12d2 and an upper layer 12d3 are included in the surface layer 12d, as illustrated in FIG. 7. The lower layer 12d1 is, for example, a GaN layer (i-GaN layer) to which impurities are not doped. The intermediate layer 12d2 is, for example, an AlGaN layer (i-AlGaN layer) to which impurities are not doped. The upper layer 12d3 is, for example, a GaN layer (i-GaN layer) to which impurities are not doped.

The two recesses 32a and 32b of which depths are different from one another are formed at the surface layer 12d as same as the second embodiment. The depth of the recess 32a is, for example, larger than a total thickness of the upper layer 12d3 and the intermediate layer 12d2, and smaller than a total thickness of the upper layer 12d3, the intermediate layer 12d2 and the lower layer 12d1. Besides, the depth of the recess 32b is, for example, substantially equal to the total thickness of the upper layer 12d3 and the intermediate layer 12d2.

Besides, a gate recess 34 is formed in the upper layer 12d3 and the intermediate layer 12d2, and the gate electrode 13 is in contact with the lower layer 12d1 via the gate recess 34. The other constitutions are the same as the first embodiment.

In the GaN-based HEMT constituted as stated above, a difference of sheet resistances between at downward of the recesses 32a and 32b and at a periphery thereof is large compared to the second embodiment by an influence of the lower layer 12d1, the intermediate layer 12d2 and the upper layer 12d3, which are included in the surface layer 12d. Accordingly, the voltage drop caused by the depletion layer 42 is further easy to occur. Therefore, according to the fourth embodiment, it is possible to further suppress the current collapse by effectively concentrating the electric field at downward of the recesses 32a and 32b.

Note that the surface layer 12d of the fourth embodiment may be applied to the first embodiment and the third embodiment.

Next, a method of manufacturing the GaN-based HEMT according to the fourth embodiment is described. FIG. 8A to FIG. 8K are sectional views illustrating the method of manufacturing the GaN-based HEMT according to the fourth embodiment in process sequence.

Figure 8A:
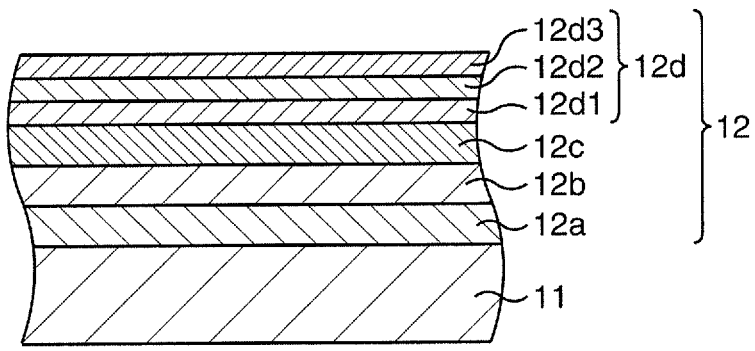
FIG. 8A to FIG. 8K are sectional views illustrating a method of manufacturing the compound semiconductor device according to the fourth embodiment in process sequence.

First, the buffer layer 12a, the electron transit layer 12b, the electron supply layer 12c, the lower layer 12d1, the intermediate layer 12d2 and the upper layer 12d3 are, for example, epitaxially grown by an MOCVD method on or above the substrate 11 such as, for example, a semi-insulating SiC substrate, as illustrated in FIG. 8A. The lower layer 12d1, the intermediate layer 12d2 and the upper layer 12d3 are included in the surface layer 12d, and the buffer layer 12a, the electron transit layer 12b, the electron supply layer 12c and the surface layer 12d are included in the compound semiconductor stacked structure 12.

Figure 8B:
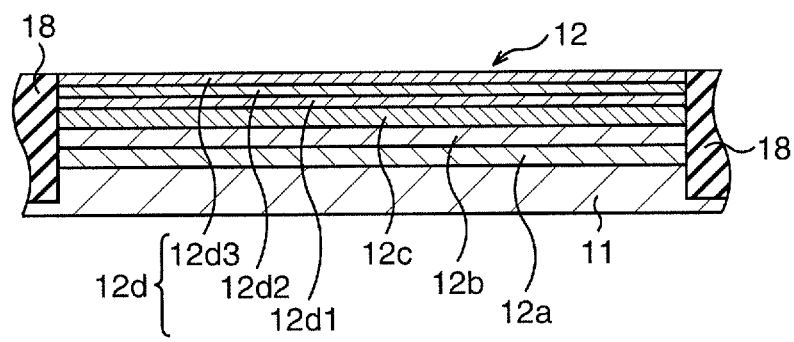

Next, Ar is selectively injected to the compound semiconductor stacked structure 12, and thereby, the element isolation region 18 defining the active region is formed in the compound semiconductor stacked structure 12 and in a surface layer part of the substrate 11, as illustrated in FIG. 8B.

Figure 8C:
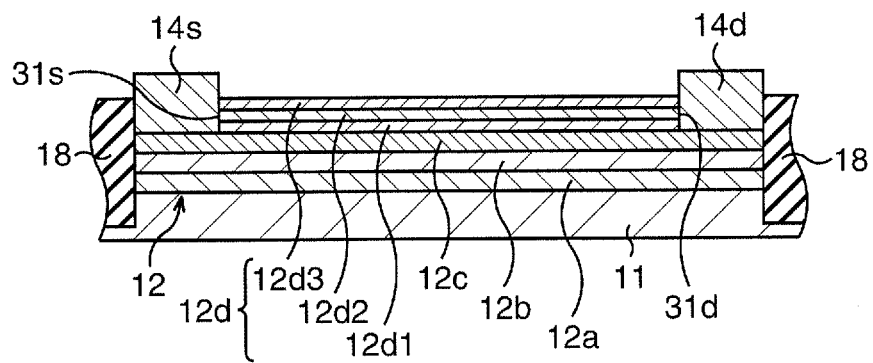

Then, the source electrode 14s and the drain electrode 14d are formed as same as the first embodiment, as illustrated in FIG. 8C.

Figure 8D:
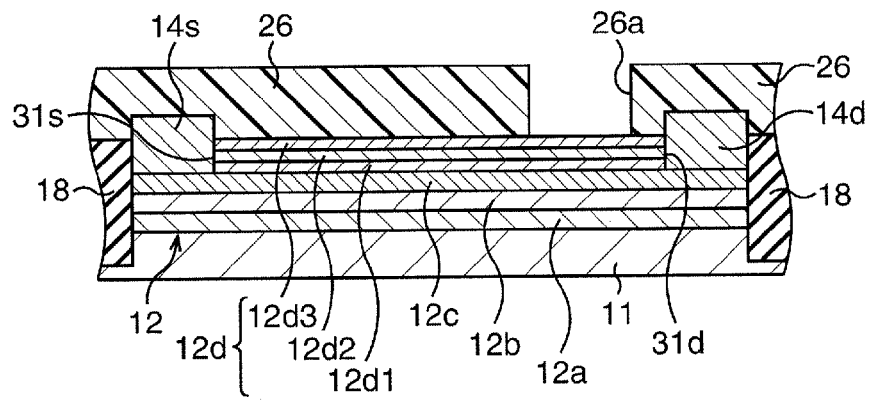

Subsequently, the resist pattern 26 having the opening 26a at a region where the recesses 32a and 32b are to be formed is formed on the compound semiconductor stacked structure 12, the source electrode 14s and the drain electrode 14d, as illustrated in FIG. 8D.

Figure 8E:
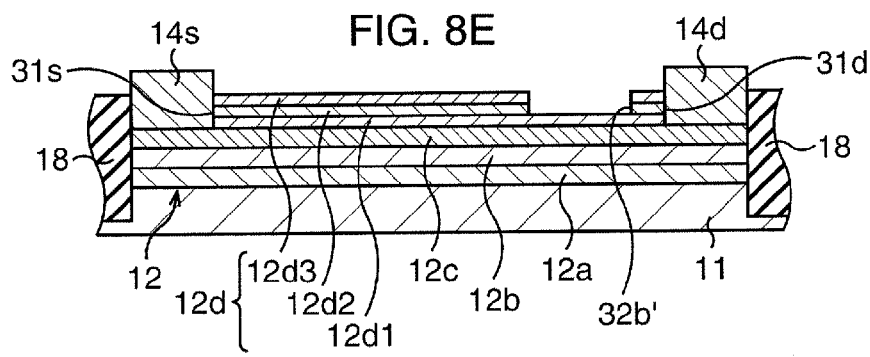

Next, a dry-etching of the upper layer 12d3 and the intermediate layer 12d2 is performed with the resist pattern 26 as a mask to thereby form the recess 32b' at the surface of the surface layer 12d, as illustrated in FIG. 8E. A width of the recess 32b' is, for example, approximately 1000 nm. The resist pattern 26 is removed after the formation of the recess 32b'.

Figure 8F:
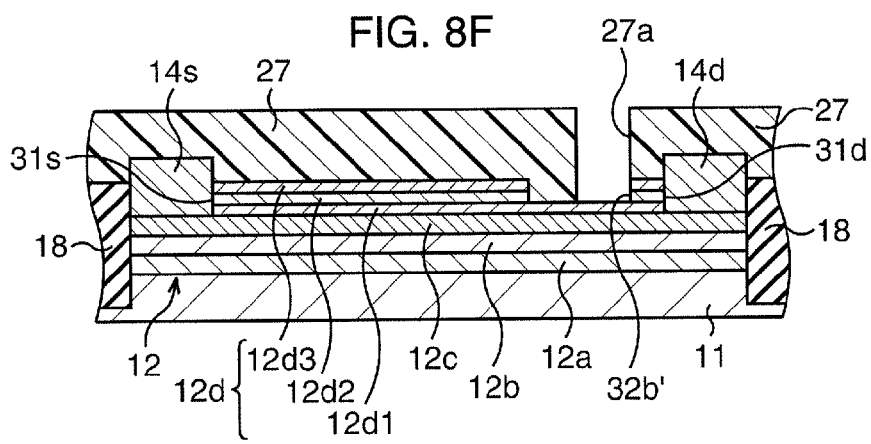

Then, the resist pattern 27 having the opening 27a at a region where the recess 32a is to be formed is formed on the compound semiconductor stacked structure 12, the source electrode 14s and the drain electrode 14d, as illustrated in FIG. 8F.

Figure 8G:
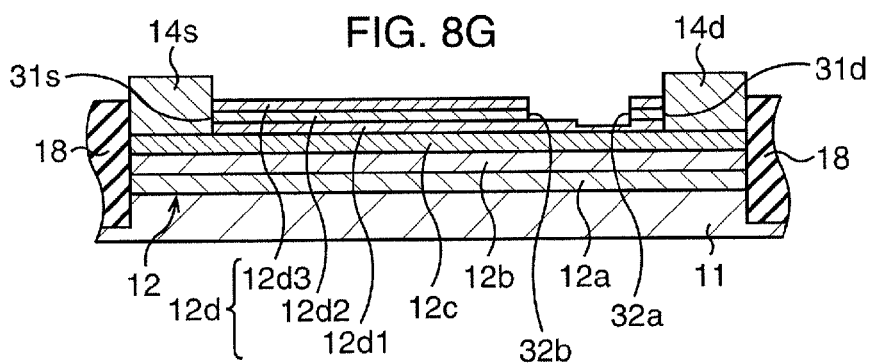

Subsequently, a dry-etching of the lower layer 12d1 is performed with the resist pattern 27 as a mask to thereby make the recess 32b' deeper and form the recess 32a, as illustrated in FIG. 8G. A width of the recess 32a is, for example, approximately 500 nm. The resist pattern 27 is removed after the formation of the recess 32a. A remainder of the recess 32b' is the recess 32b.

Figure 8H:
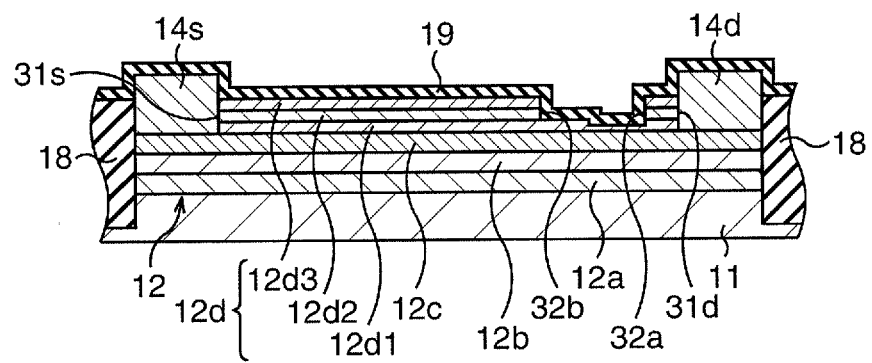

Next, the insulating film 19 covering the source electrode 14s and the drain electrode 14d is formed at a whole surface of the compound semiconductor stacked structure 12, as illustrated in FIG. 8H.

Figure 8I:
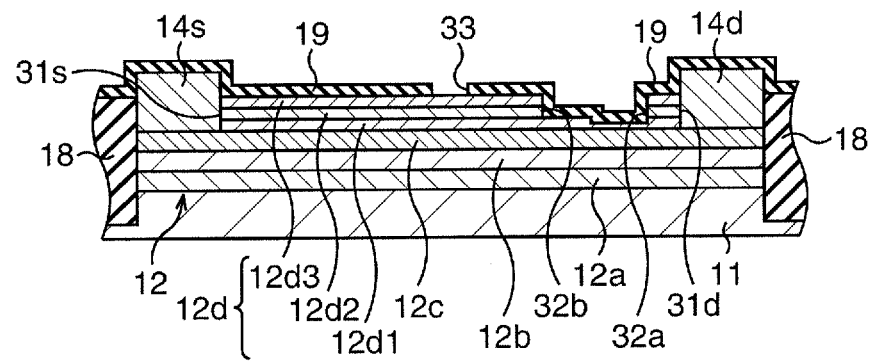

Then, the resist pattern 23 having the opening 23a at a region where the opening for the gate electrode is to be formed is formed on the insulating film 19, as illustrated in FIG. 8I. A dry-etching is performed with the resist pattern 23 as a mask to thereby form the opening 33 in the insulating film 19. A width of the opening 33 is, for example, approximately 600 nm.

Figure 8J:
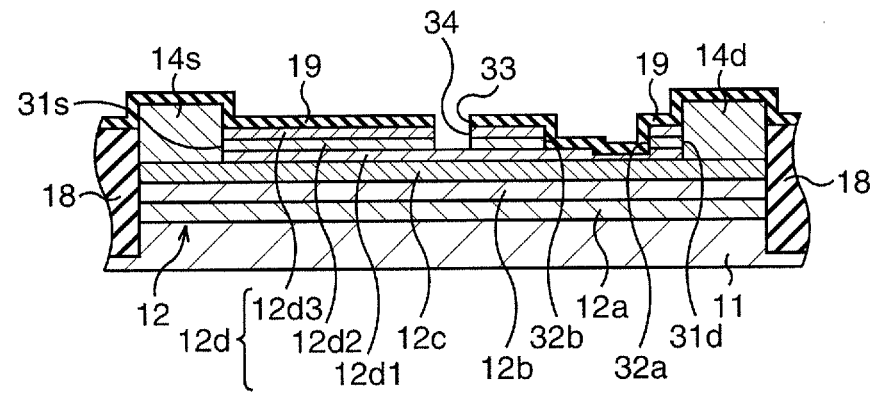

Subsequently, a dry-etching is performed with the resist pattern 23 as a mask to thereby form the gate recess 34 in the upper layer 12d3 and the intermediate layer 12d2, as illustrated in FIG. 8J. For example, $Cl_2$ gas is used in this dry-etching. The resist pattern 23 is removed after the formation of the gate recess 34.

Figure 8K:
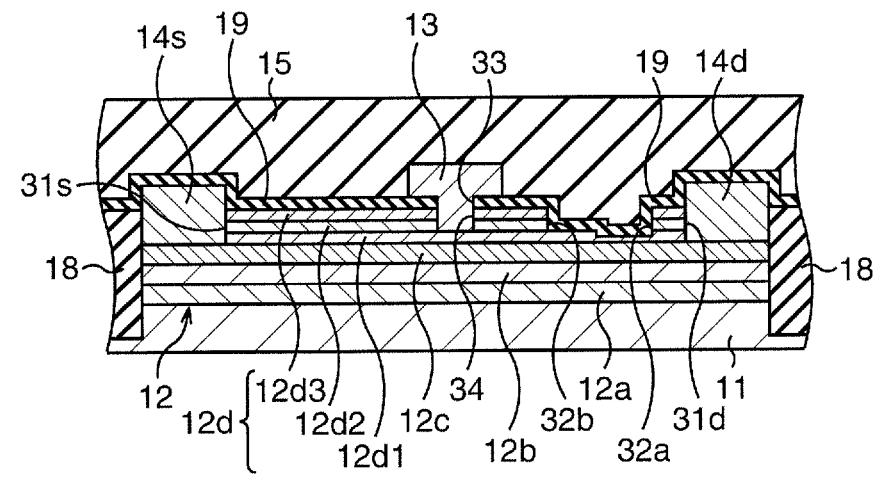

Next, the gate electrode 13 and the insulating film 15 are formed as same as the first embodiment, as illustrated in FIG. 8K.

A protective film, wirings, and so on are formed according to need to thereby complete the GaN-based HEMT (semiconductor device).

Fifth Embodiment

Next, a fifth embodiment is described. FIG. 9 is a sectional view illustrating a structure of a GaN-based HEMT (compound semiconductor device) according to the fifth embodiment.

In the fifth embodiment, the gate recess 34 is formed to be deeper than the fourth embodiment, to reach up to a part of the electron supply layer 12c, as illustrated in FIG. 9. The other constitutions are the same as the fourth embodiment.

In the GaN-based HEMT constituted as stated above, the depletion layer 41 spreads to a region where 2DEG exists in the vicinity of the surface of the electron transit layer 12b. Accordingly, the GaN-based HEMT can be operated in an enhanced mode.

Note that, for example, an etching time when the gate recess 34 is formed is made longer than the fourth embodiment to manufacture the compound semiconductor device according to the fifth embodiment.

Besides, the gate recess 34 of the fifth embodiment may be applied to the first to third embodiments.

Sixth Embodiment

Figure 10:
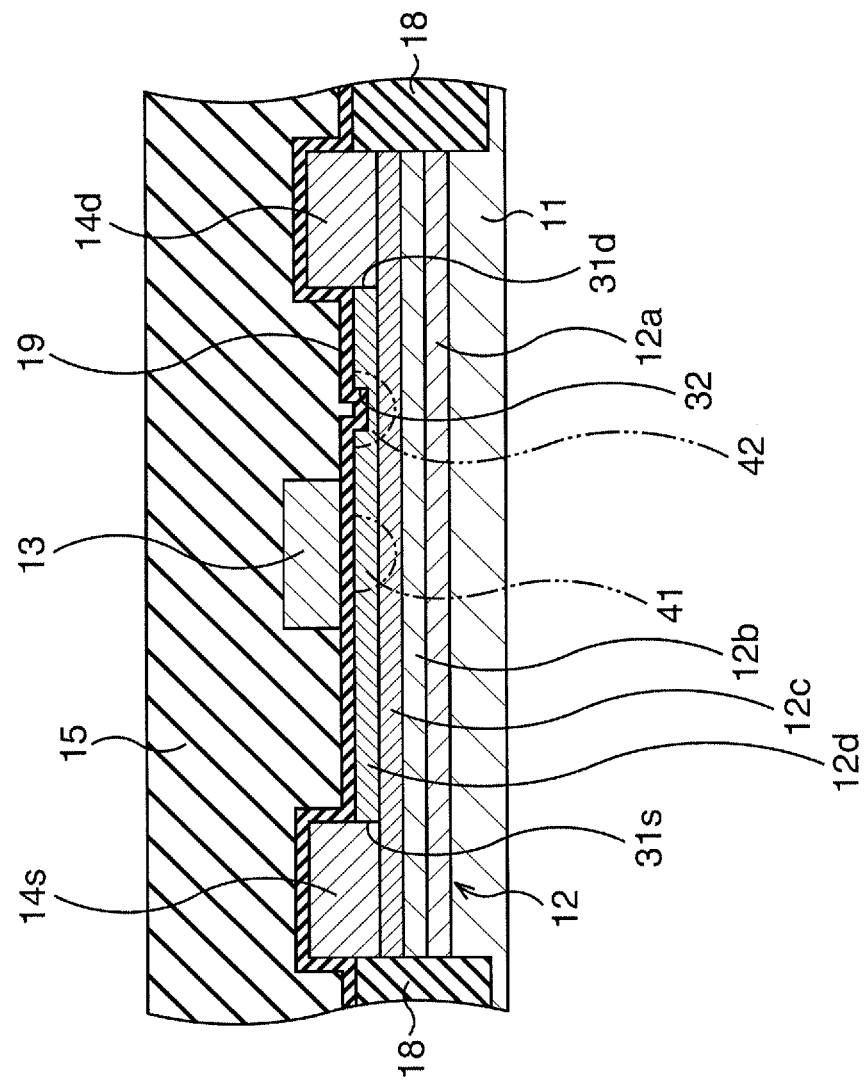
FIG. 10 is a sectional view illustrating a structure of a compound semiconductor device according to a sixth embodiment.

Next, a sixth embodiment is described. FIG. 10 is a sectional view illustrating a structure of a GaN-based HEMT (compound semiconductor device) according to the sixth embodiment.

A Schottky-junction is formed between the gate electrode 13 and the compound semiconductor stacked structure 12 in the first embodiment. On the other hand, the insulating film 19 lies between the gate electrode 13 and the compound semiconductor stacked structure 12, and the insulating film 19 functions as a gate insulating film in the sixth embodiment. Namely, the opening 33 is not formed in the insulating film 19, and an MIS type structure is employed.

It is also possible to suppress the current collapse while avoiding the increase of the parasitic capacitance according to the sixth embodiment as stated above as same as the first embodiment.

Note that a material of the insulating film 19 is not particularly limited, but for example, an oxide, a nitride or an oxynitride of Si, Al, Hf, Zr, Ti, Ta or W is preferable, and an Al oxide is particularly preferable. Besides, a thickness of the insulating film 19 is 2 nm to 200 nm, for example, approximately 10 nm.

Figure 11:
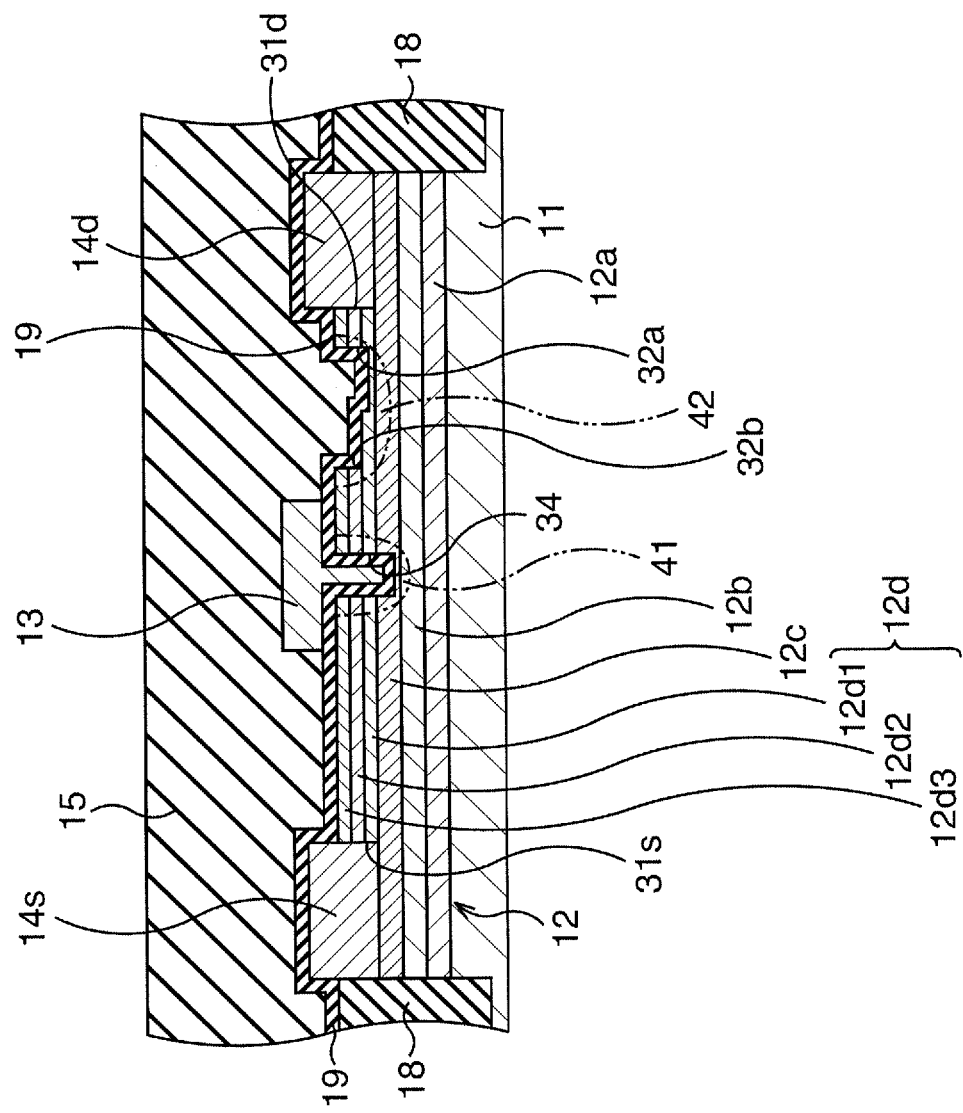
FIG. 11 is a sectional view illustrating a structure obtained when an MIS structure is applied to the fifth embodiment.
Figure 12:
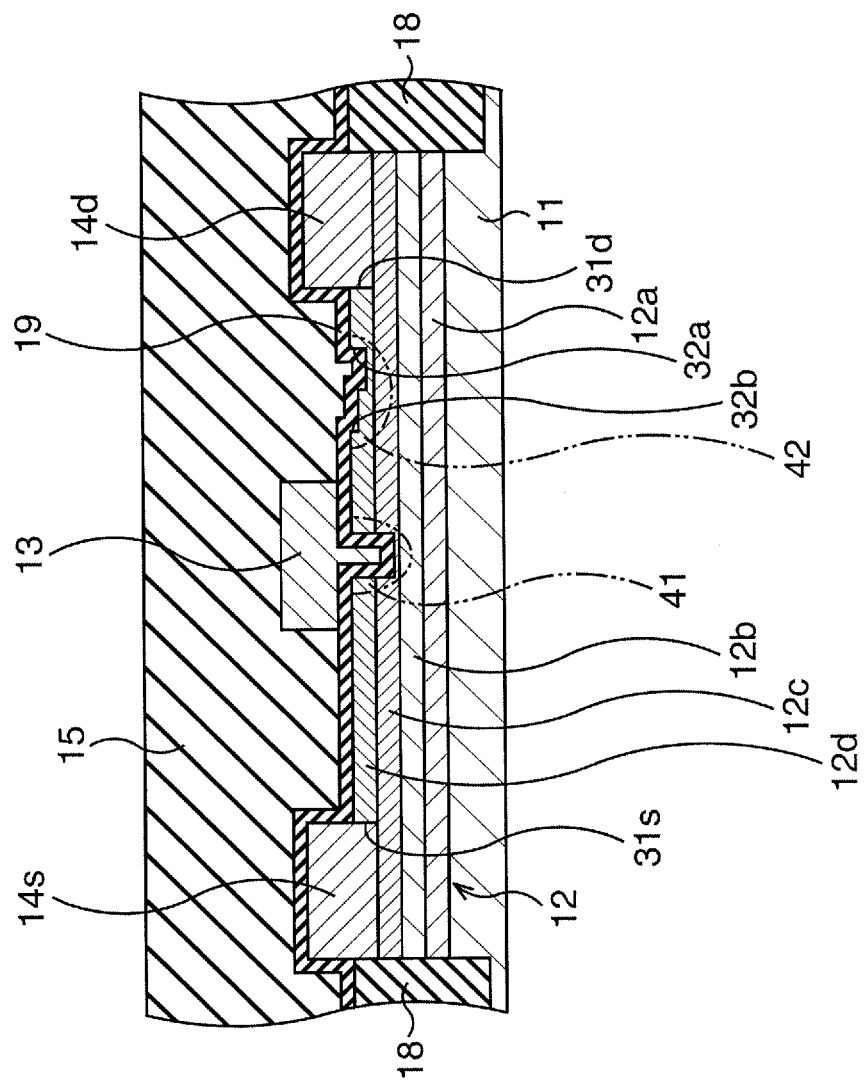
FIG. 12 is a sectional view illustrating a structure obtained when an MIS structure and a gate recess are applied to the second embodiment.

Besides, the MIS type structure as stated above may be applied to the second to fifth embodiments. For example, the formation of the opening 33 is not to be performed to obtain the insulating film 19 included in the MIS type structure as stated above. A structure obtained when the MIS structure is applied to the fifth embodiment is illustrated in FIG. 11, and a structure obtained when the MIS structure and the gate recess are applied to the second embodiment is illustrated in FIG. 12.

Seventh Embodiment

Figure 13:
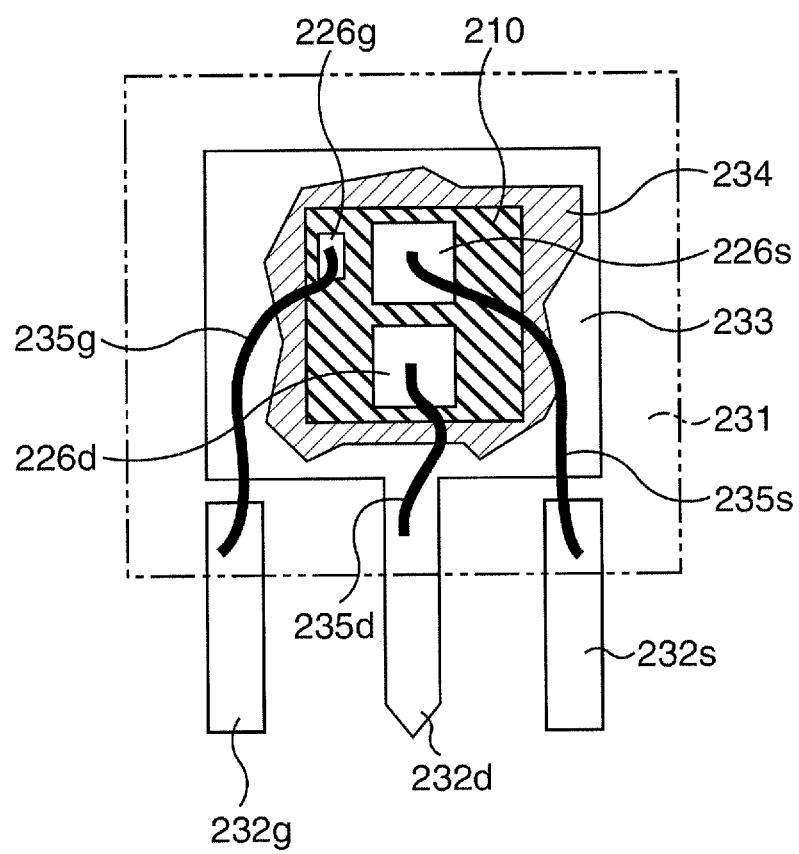
FIG. 13 is a drawing illustrating a discrete package according to a seventh embodiment.

A seventh embodiment relates to a discrete package of a compound semiconductor device which includes a GaN-based HEMT. FIG. 13 is a view illustrating the discrete package according to the seventh embodiment.

In the seventh embodiment, as illustrated in FIG. 13, a back surface of a HEMT chip 210 of the compound semiconductor device according to any one of the first to sixth embodiments is fixed on a land (die pad) 233, using a die attaching agent 234 such as solder. One end of a wire 235d such as an Al wire is bonded to a drain pad 226d, to which the drain electrode 14d is connected, and the other end of the wire 235d is bonded to a drain lead 232d integral with the land 233. One end of a wire 235s such as an Al wire is bonded to a source pad 226s, to which the source electrode 14s is connected, and the other end of the wire 235s is bonded to a source lead 232s separated from the land 233. One end of a wire 235g such as an Al wire is bonded to a gate pad 226g, to which the gate electrode 13 is connected, and the other end of the wire 235g is bonded to a gate lead 232g separated from the land 233. The land 233, the HEMT chip 210 and so forth are packaged with a molding resin 231, so as to project outwards a portion of the gate lead 232g, a portion of the drain lead 232d, and a portion of the source lead 232s.

The discrete package may be manufactured by the procedures below, for example. First, the HEMT chip 210 is bonded to the land 233 of a lead frame, using a die attaching agent 234 such as solder. Next, with the wires 235g, 235d and 235s, the gate pad 226g is connected to the gate lead 232g of the lead frame, the drain pad 226d is connected to the drain lead 232d of the lead frame, and the source pad 226s is connected to the source lead 232s of the lead frame, respectively, by wire bonding. Then molding with the molding resin 231 is conducted by a transfer molding process. The lead frame is then cut away.

Eighth Embodiment

Figure 14:
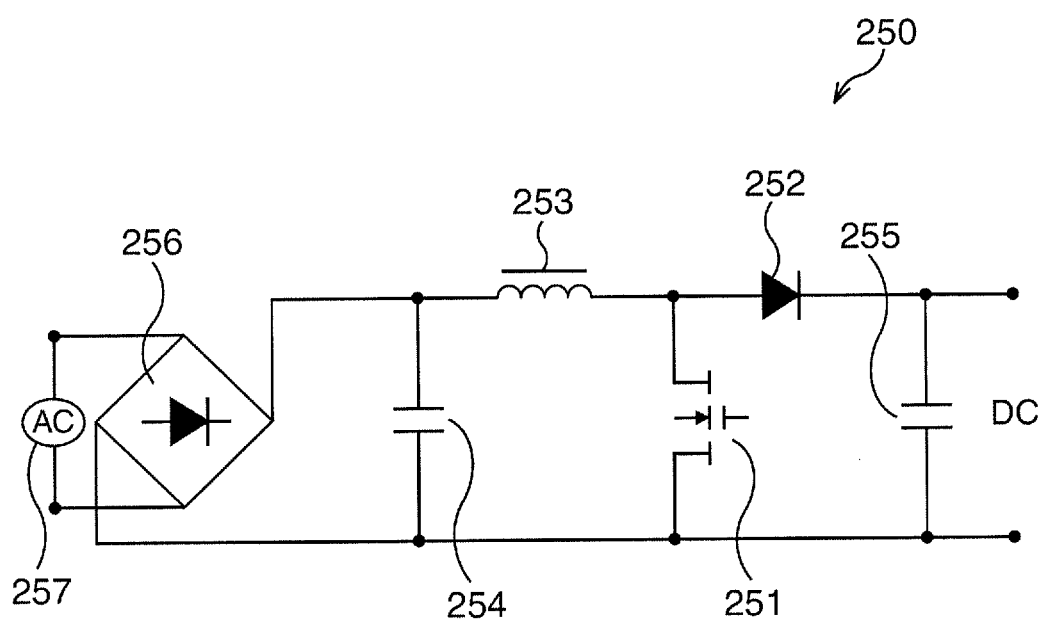
FIG. 14 is a wiring diagram illustrating a power factor correction (PFC) circuit according to an eighth embodiment.

Next, an eighth embodiment will be explained. The eighth embodiment relates to a PFC (power factor correction) circuit equipped with a compound semiconductor device which includes a GaN-based HEMT. FIG. 14 is a wiring diagram illustrating the PFC circuit according to the eighth embodiment.

The PFC circuit 250 includes a switching element (transistor) 251, a diode 252, a choke coil 253, capacitors 254 and 255, a diode bridge 256, and an AC power source (AC) 257. The drain electrode of the switching element 251, the anode terminal of the diode 252, and one terminal of the choke coil 253 are connected with each other. The source electrode of the switching element 251, one terminal of the capacitor 254, and one terminal of the capacitor 255 are connected with each other. The other terminal of the capacitor 254 and the other terminal of the choke coil 253 are connected with each other. The other terminal of the capacitor 255 and the cathode terminal of the diode 252 are connected with each other. A gate driver is connected to the gate electrode of the switching element 251. The AC 257 is connected between both terminals of the capacitor 254 via the diode bridge 256. A DC power source (DC) is connected between both terminals of the capacitor 255. In the embodiment, the compound semiconductor device according to any one of the first to sixth embodiments is used as the switching element 251.

In the process of manufacturing the PFC circuit 250, for example, the switching element 251 is connected to the diode 252, the choke coil 253 and so forth with solder, for example.

Ninth Embodiment

Figure 15:
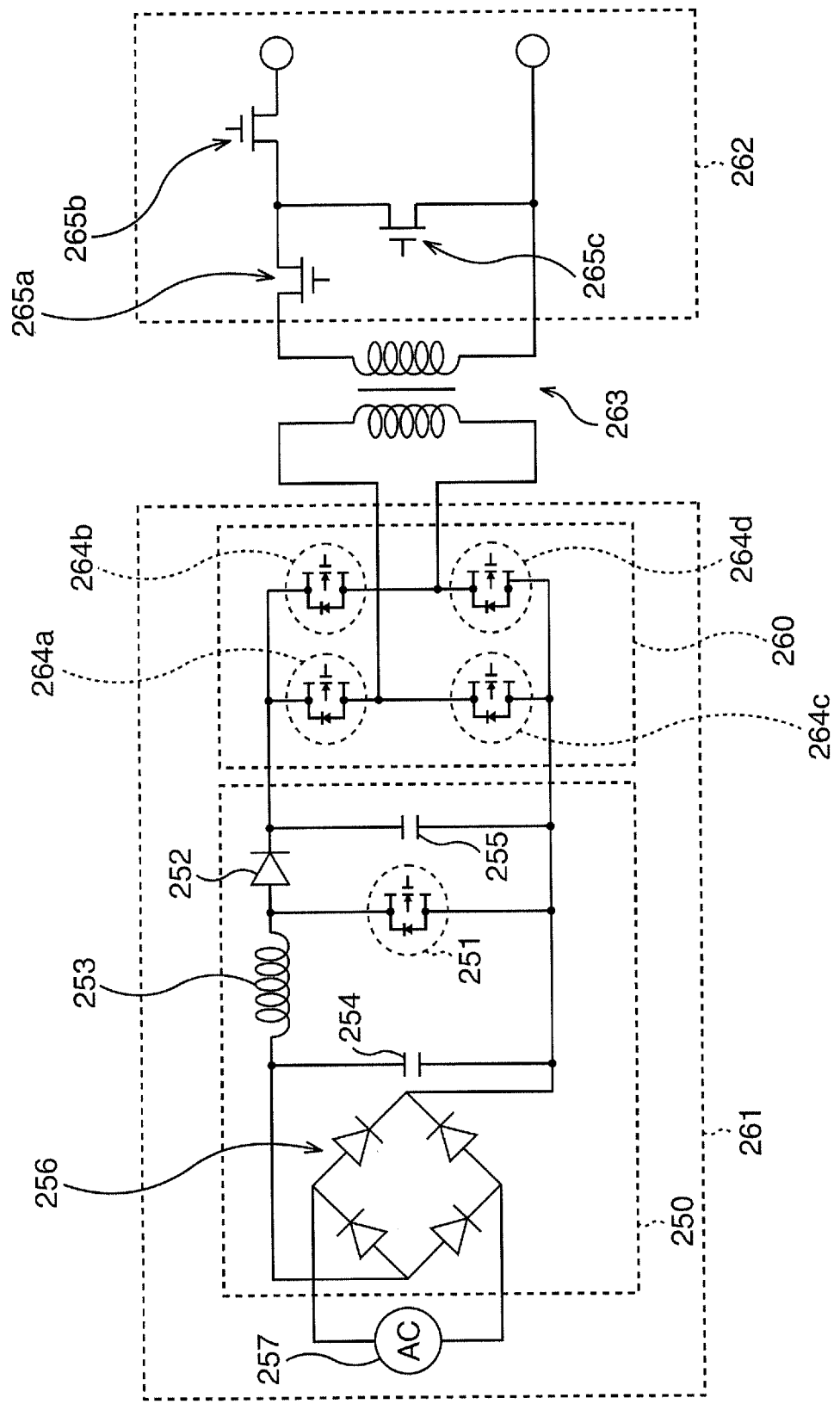
FIG. 15 is a wiring diagram illustrating a power supply apparatus according to a ninth embodiment.

Next, a ninth embodiment will be explained. The ninth embodiment relates to a power supply apparatus equipped with a compound semiconductor device which includes a GaN-based HEMT. FIG. 15 is a wiring diagram illustrating the power supply apparatus according to the ninth embodiment.

The power supply apparatus includes a high-voltage, primary-side circuit 261, a low-voltage, secondary-side circuit 262, and a transformer 263 arranged between the primary-side circuit 261 and the secondary-side circuit 262.

The primary-side circuit 261 includes the PFC circuit 250 according to the eighth embodiment, and an inverter circuit, which may be a full-bridge inverter circuit 260, for example, connected between both terminals of the capacitor 255 in the PFC circuit 250. The full-bridge inverter circuit 260 includes a plurality of (four, in the embodiment) switching elements 264a, 264b, 264c and 264d.

The secondary-side circuit 262 includes a plurality of (three, in the embodiment) switching elements 265a, 265b and 265c.

In the embodiment, the compound semiconductor device according to any one of first to sixth embodiments is used for the switching element 251 of the PFC circuit 250, and for the switching elements 264a, 264b, 264c and 264d of the full-bridge inverter circuit 260. The PFC circuit 250 and the full-bridge inverter circuit 260 are components of the primary-side circuit 261. On the other hand, a silicon-based general MIS-FET (field effect transistor) is used for the switching elements 265a, 265b and 265c of the secondary-side circuit 262.

Tenth Embodiment

Figure 16:
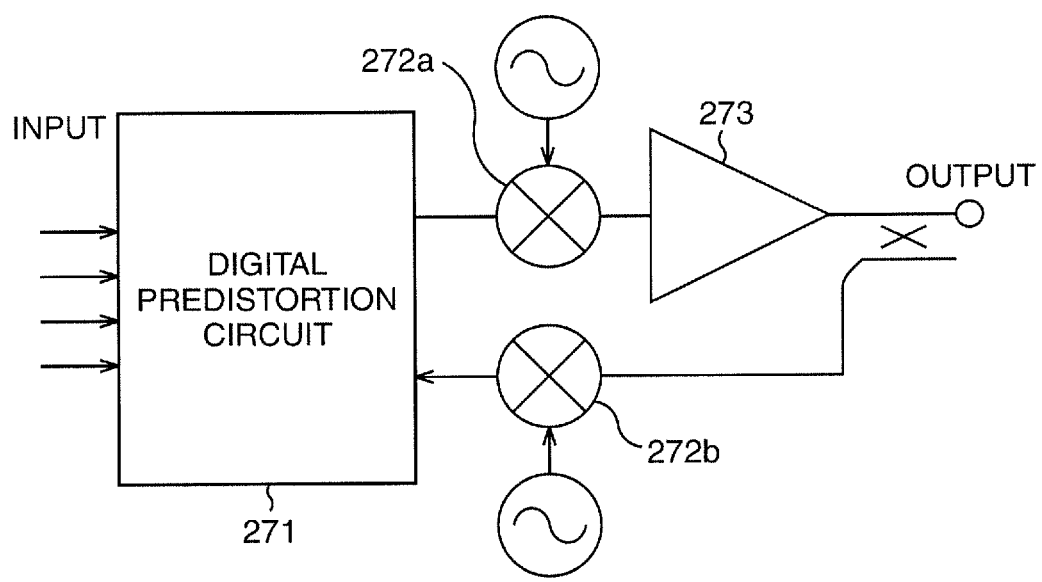
FIG. 16 is a wiring diagram illustrating a high-frequency amplifier according to a tenth embodiment.

Next, a tenth embodiment will be explained. The tenth embodiment relates to a high-frequency amplifier equipped with a compound semiconductor device which includes a GaN-based HEMT. FIG. 16 is a wiring diagram illustrating the high-frequency amplifier according to the tenth embodiment.

The high-frequency amplifier includes a digital predistortion circuit 271, mixers 272a and 272b, and a power amplifier 273.

The digital predistortion circuit 271 compensates non-linear distortion in input signals. The mixer 272a mixes the input signal having the non-linear distortion already compensated, with an AC signal. The power amplifier 273 includes the compound semiconductor device according to any one of the first to sixth embodiments, and amplifies the input signal mixed with the AC signal. In the illustrated example of the embodiment, the signal on the output side may be mixed, upon switching, with an AC signal by the mixer 272b, and may be sent back to the digital predistortion circuit 271.

Composition of the compound semiconductor layers used for the compound semiconductor stacked structure is not specifically limited, and GaN, AlN, InN and so forth may be used. Also mixed crystals of them may be used.

Configurations of the gate electrode, the source electrode and the drain electrode are not limited to those in the above-described embodiments. For example, they may be configured by a single layer. The method of forming these electrodes is not limited to the lift-off process. The annealing after the formation of the source electrode and the drain electrode may be omissible, so long as the ohmic characteristic is obtainable. The gate electrode may be annealed.

In the embodiments, the substrate may be a silicon carbide (SiC) substrate, a sapphire substrate, a silicon substrate, a GaN substrate, a GaAs substrate or the like. The substrate may be any of electro-conductive, semi-insulating, and insulating ones. The thickness, the material, and so on of each layer may not be limited to the above-stated embodiments.

Next, experiments performed by the present inventor are described.

First Experiment

In a first experiment, three-terminal characteristics of the reference example illustrated in FIG. 1, the first embodiment, and the second embodiment were measured. Results are illustrated in FIG. 17A to FIG. 17C. FIG. 17A illustrates the three-terminal characteristics of the reference example, FIG. 17B illustrates the three-terminal characteristics of the first embodiment, and FIG. 17C illustrates the three-terminal characteristics of the second embodiment. Besides, a horizontal axis of these graphs represents a source-drain voltage Vds, and a vertical axis of these graphs represents a source-drain current Ids.

As illustrated in FIG. 17A to FIG. 17C, the current collapse was drastically suppressed in the first embodiment and the second embodiment compared to the reference example. Besides, it was also verified that the parasitic capacitance $C_{gs}$ and the parasitic capacitance $C_{ds}$ were almost reduced by half from a measurement result of an S parameter.

Second Experiment

Figure 18A:
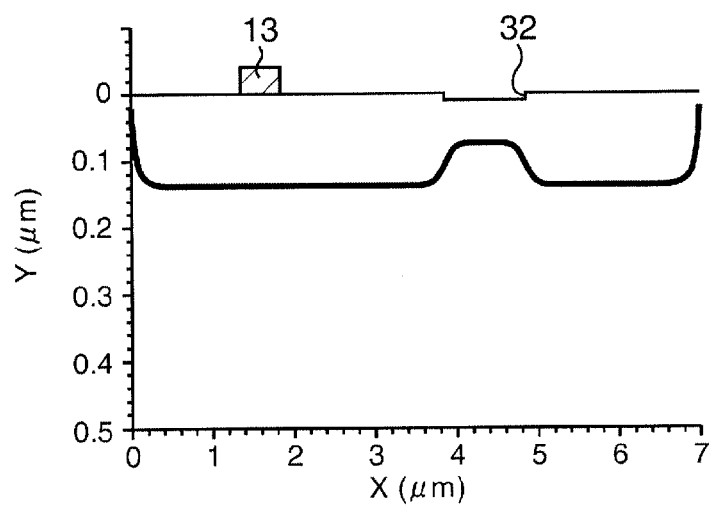
FIG. 18A to FIG. 18C are views illustrating results of a second experiment.
Figure 18B:
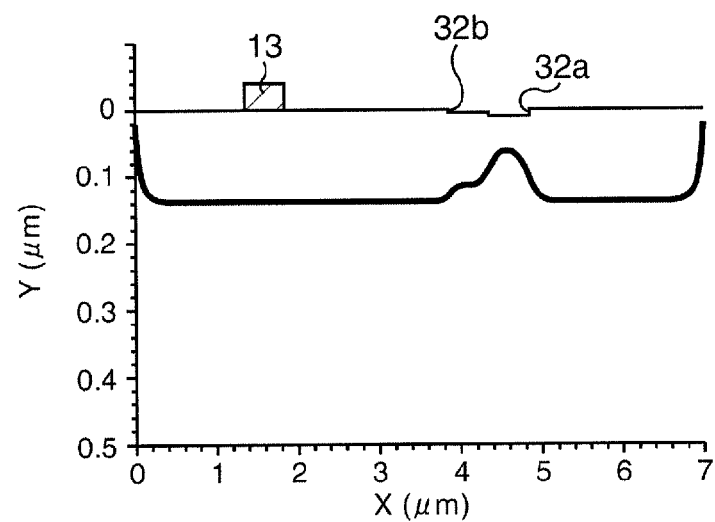
Figure 18C:
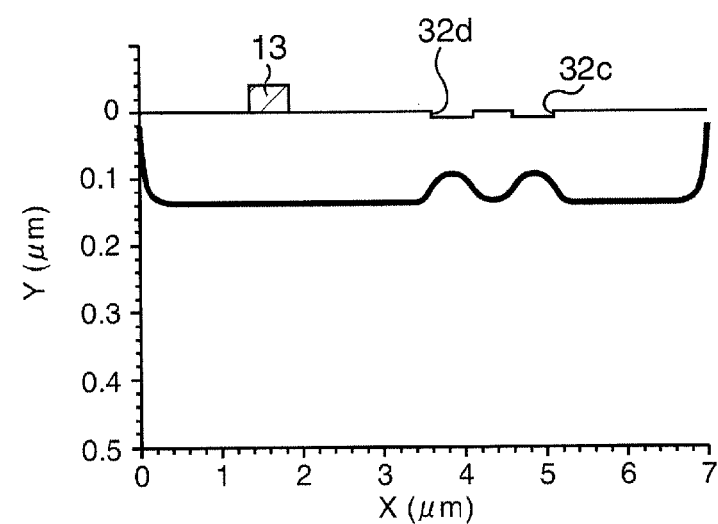

In a second experiment, a simulation relating to an electron concentration distribution was performed. A result as for a structure in which the single recess 32 was formed (refer to FIG. 2A) corresponding to the first embodiment is illustrated in FIG. 18A. A result as for a structure in which the two recesses 32a and 32b of which depths were different from each other were continuously formed (refer to FIG. 4) corresponding to the second embodiment is illustrated in FIG. 18B. A result as for a structure in which the two recesses 32c and 32d were formed to be apart from each other (refer to FIG. 6) corresponding to the third embodiment is illustrated in FIG. 18C. Thick lines in FIG. 18A to FIG. 18C represent a depth of a region where an electron concentration from the surface of the compound semiconductor layer was $1 \times 10^{13}$ cm$^{-3}$, and gradients of the thick lines correlate with the electric field intensity. It has been obvious from the simulation results that the structures corresponding to the second and third embodiments contribute to a reduction of the electric field intensity compared to the structure corresponding to the first embodiment.

According to the above-stated compound semiconductor device and so on, the proper recess is formed at the surface of the compound semiconductor stacked structure, and therefore, it is possible to obtain high gain while suppressing a current collapse.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a substrate;
   a nitride compound semiconductor stacked structure formed on or above the substrate; and
   a gate electrode, a source electrode and a drain electrode formed on or above the compound semiconductor stacked structure,
   wherein
   the compound semiconductor stacked structure comprises:
     a nitride electron transit layer;
     a nitride electron supply layer formed on or above the nitride electron transit layer; and
     a nitride surface layer formed on or above the nitride electron supply layer,
   the nitride surface layer comprises:
     a GaN lower layer;
     an AlGaN intermediate layer formed on the GaN lower layer; and
     a GaN upper layer formed on the AlGaN intermediate layer, and
     a recess comprising a plurality of depths formed at the nitride surface layer between the drain electrode and an end portion of the gate electrode on the drain electrode side in a plan view,
     wherein a first one of the plurality of depths is not less than a total thickness of the GaN upper layer and the AlGaN intermediate layer and not more than a total thickness of the GaN upper layer, the AlGaN intermediate layer and the GaN lower layer,
     wherein the first one of the plurality of depths extends through the GaN upper layer, through the AlGaN intermediate layer, and partially through the GaN lower layer.

2. The compound semiconductor device according to claim 1, wherein
   a gate recess is formed at a surface of the compound semiconductor stacked structure, and
   a part of the gate electrode is positioned in the gate recess.

3. A manufacturing method of a compound semiconductor device, comprising:
   forming a nitride compound semiconductor stacked structure on or above a substrate, the forming of the compound semiconductor stacked structure comprising:

forming a nitride electron transit layer;
forming a nitride electron supply layer on or above the nitride electron transit layer; and
forming a nitride surface layer on or above the nitride electron supply layer, and the forming of the nitride surface layer comprising:

forming a GaN lower layer;
forming an AlGaN intermediate layer on the GaN lower layer; and
forming a GaN upper layer on the AlGaN intermediate layer;
forming a gate electrode, a source electrode and a drain electrode on or above the compound semiconductor stacked structure; and
forming a recess comprising a plurality of depths at the nitride surface layer between the drain electrode and an end portion of the gate electrode on the drain electrode side in a plan view,
wherein a first one of the plurality of depths is not less than a total thickness of the GaN upper layer and the AlGaN intermediate layer and not more than a total thickness of the GaN upper layer, the AlGaN intermediate layer and the GaN lower layer,
wherein the first one of the plurality of depths extends through the GaN upper layer, through the AlGaN intermediate layer, and partially through the GaN lower layer.

* * * * *